US012686945B2

(12) United States Patent
Kaneko

(10) Patent No.: US 12,686,945 B2
(45) Date of Patent: Jul. 21, 2026

(54) SiC SUBSTRATE, SiC SUBSTRATE PRODUCTION METHOD, SiC SEMICONDUCTOR DEVICE, AND SiC SEMICONDUCTOR DEVICE PRODUCTION METHOD

(71) Applicants: KWANSEI GAKUIN EDUCATIONAL FOUNDATION, Hyogo (JP); TOYOTA TSUSHO CORPORATION, Nagoya (JP)

(72) Inventor: Tadaaki Kaneko, Sanda (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 772 days.

(21) Appl. No.: 17/763,142

(22) PCT Filed: Sep. 24, 2020

(86) PCT No.: PCT/JP2020/036004
§ 371 (c)(1),
(2) Date: Mar. 23, 2022

(87) PCT Pub. No.: WO2021/060369
PCT Pub. Date: Apr. 1, 2021

(65) Prior Publication Data
US 2022/0359667 A1     Nov. 10, 2022

(30) Foreign Application Priority Data
Sep. 27, 2019   (JP) ................................. 2019-178020

(51) Int. Cl.
*C30B 29/36* (2006.01)
*C30B 23/06* (2006.01)
*H10D 62/832* (2025.01)
*H10P 14/20* (2026.01)
*H10P 14/22* (2026.01)

(52) U.S. Cl.
CPC .............. *C30B 29/36* (2013.01); *C30B 23/06* (2013.01); *H10D 62/8325* (2025.01);
(Continued)

(58) Field of Classification Search
CPC .... C30B 29/36; C30B 23/06; H10D 62/8325; H01L 21/02378; H01L 21/02433;
(Continued)

(56) References Cited

U.S. PATENT DOCUMENTS

2009/0085044 A1     4/2009   Ohno et al.
2009/0302328 A1*   12/2009   Ohno ................ H01L 21/02447
257/77
(Continued)

FOREIGN PATENT DOCUMENTS

CN        101877309 A    11/2010
JP        2009-88223 A    4/2009
(Continued)

OTHER PUBLICATIONS

English Translation of International Search Report from PCT/JP2020/036004 dated Dec. 1, 2020 (3 pages).
(Continued)

*Primary Examiner* — Jessica S Manno
*Assistant Examiner* — Andrew Chung
(74) *Attorney, Agent, or Firm* — Calfee, Halter & Griswold LLP

(57) ABSTRACT

The present invention addresses the issue of providing: an SiC substrate having a dislocation conversion layer that can reduce resistance; and a novel technology pertaining to SiC semiconductors. This SiC substrate and SiC semiconductor device comprise a dislocation conversion layer 12 having a doping concentration of at least $1\times10^{15}$ cm$^{-3}$. As a result of comprising a dislocation conversion layer 12 having this kind of doping concentration: expansion of basal plane
(Continued)

dislocations and the occurrence of high-resistance stacking faults can be suppressed; and resistance when SiC semiconductor devices are produced can be reduced.

10 Claims, 14 Drawing Sheets

(52) U.S. Cl.
CPC .......... *H10P 14/22* (2026.01); *H10P 14/2904* (2026.01); *H10P 14/2926* (2026.01); *H10P 14/3208* (2026.01); *H10P 14/3408* (2026.01); *H10P 14/36* (2026.01)

(58) Field of Classification Search
CPC ......... H01L 21/02447; H01L 21/02529; H01L 21/02631; H01L 21/02658; H10P 14/36; H10P 14/2904; H10P 14/2926; H10P 14/22; H10P 14/3408; H10P 14/3208
See application file for complete search history.

(56) References Cited

U.S. PATENT DOCUMENTS

| | | | |
|---|---|---|---|
| 2016/0251775 A1* | 9/2016 | Aigo | .................... H01L 21/0262 117/101 |
| 2018/0216251 A1 | 8/2018 | Aigo et al. | |

| | | | |
|---|---|---|---|
| 2018/0286683 A1 | 10/2018 | Matsunaga | |
| 2019/0376206 A1 | 12/2019 | Fukada et al. | |
| 2020/0006066 A1 | 1/2020 | Konishi et al. | |
| 2020/0056302 A1* | 2/2020 | Balachandran | ... H01L 21/02658 |
| 2020/0127083 A1* | 4/2020 | Nishio | ................. H10D 12/441 |

FOREIGN PATENT DOCUMENTS

| | | | |
|---|---|---|---|
| JP | 2015-002207 | A | 1/2015 |
| JP | 2018-113303 | A | 7/2018 |
| JP | 2018-166196 | A | 10/2018 |
| WO | 2017/018533 | A1 | 2/2017 |
| WO | 2018/150861 | A1 | 8/2018 |
| WO | 2018/160785 | A1 | 9/2018 |

OTHER PUBLICATIONS

Ohno, T. et al., Influence of growth conditions on basal plane dislocation in 4H—SiC epitaxial layer, Journal 1-6, 10-15 of Crystal Growth, Sep. 13, 2004, vol. 271, pp. 1-7.
EPO Communication and European Search Report issued in European Application No. 20868168.4 dated Sep. 22, 2023 (8 pages).

* cited by examiner (a)

SiC SUBSTRATE, SiC SUBSTRATE PRODUCTION METHOD, SiC SEMICONDUCTOR DEVICE, AND SiC SEMICONDUCTOR DEVICE PRODUCTION METHOD

CROSS-REFERENCE TO RELATED APPLICATIONS

This application is a 371 of PCT Application No. PCT/JP2020/036004, filed on Sep. 24, 2020, which claims priority to Japanese Application No. 2019-178020, filed on Sep. 27, 2019, the contents of which are hereby incorporated by reference as if recited in their entirety.

TECHNICAL FIELD

The present invention relates to a SiC substrate, a method for producing a SiC substrate, a SiC semiconductor device, and a method for producing a SiC semiconductor device.

BACKGROUND ART

Compared to Si (silicon), SiC (silicon carbide) has a breakdown electric field that is one order of magnitude larger, a band gap that is three times larger, and a thermal conductivity that is about three times higher. Therefore, SiC is expected to be applied to power devices, high frequency devices, and high temperature operation devices.

Basal plane dislocation (BPD) is known to be one of the device killer defects that cause fatal defects in SiC semiconductor devices.

Most of the BPDs in SiC substrates are converted to threading edge dislocation (TED) during the formation of the epitaxial growth layer (drift layer). However, there was a problem that some of BPDs were directly carried over to the epitaxial growth layer.

When minority carriers reach the BPD when forward current is applied to the device, the BPD expands and becomes a highly resistive stacking fault (SF). That is, SF is generated starting from BPD by energy generated when holes as minority carriers recombine with electrons. If high resistance areas are created in the device, the reliability of the device will be degraded.

To address these problems, a technology has been proposed to add a dislocation conversion layer between the base substrate and the epitaxial growth layer to perform BPD to TED conversion (see, for example, Patent Literature 1). Thus, by providing a dislocation conversion layer with high dislocation conversion efficiency between the base substrate and the epitaxial growth layer, the BPD is prevented from being taken over by the epitaxial growth layer.

A technology has also been proposed to provide a recombination promotion layer between the dislocation conversion layer and the epitaxial growth layer to promote recombination of minority carriers (see, for example, Patent Literature 2). Thus, by providing a recombination promotion layer that eliminates minority carriers between the dislocation conversion layer and the epitaxial growth layer, the energy generated by recombination is given to the BPDs to suppress the generation of SF.

CITATION LIST

Patent Literature

Patent Literature 1: JP 2009-88223 A
Patent Literature 2: JP 2018-166196 A

2

SUMMARY OF INVENTION

Technical Problem

FIG. 17 illustrates a cross-sectional view of a SiC substrate that has undergone a known treatment to suppress stacking faults. As illustrated in FIG. 17, this SiC substrate 100 includes an n+ type SiC base substrate 101, an n type dislocation conversion layer 102, an n+ type recombination promotion layer 103, and an n type epitaxial growth layer 104.

The known n type dislocation conversion layer 102 requires a low doping concentration in order to improve the conversion rate of BPD to TED conversion (hereinafter referred to as the BPD to TED conversion rate). For example, Patent Literature 1 describes that the doping concentration of the dislocation conversion layer is preferably $1 \times 10^{15}$ cm$^{-3}$ or less.

However, when the n type dislocation conversion layer 102 is set to a low doping concentration, as described in Patent Literature 1, there is a problem that the resistance of the SiC semiconductor device would increase. In other words, there is a trade-off between the BPD to TED conversion rate and the resistance of the SiC semiconductor device, and it was difficult to achieve both.

In the known treatment to suppress stacking faults, an n+ type recombination promotion layer 103 is formed to suppress the generation of SF. Therefore, it is necessary to grow the n type dislocation conversion layer 102, the n+ type recombination promotion layer 103, and the n type epitaxial growth layer 104 on the n+ type SiC base substrate 101, which complicates the process such as setting growth conditions.

In view of the aforementioned problems, the problem to be solved by the present invention is to provide a new technology for a SiC substrate having a dislocation conversion layer that can reduce resistance and a SiC semiconductor.

The disclosed technology also provides a novel technology for producing a SiC substrate having a dislocation conversion layer that can reduce resistance, and a SiC semiconductor.

Solution to Problem

The present invention that solves the above problems is a SiC substrate including a dislocation conversion layer having a doping concentration of $1 \times 10^{15}$ cm$^{-3}$ or more.

By including the dislocation conversion layer having such a doping concentration, the resistance in the dislocation conversion layer can be reduced.

In a preferred mode of the present invention, a dislocation conversion layer having a doping concentration of $1 \times 10^{17}$ cm$^{-3}$ or more is included.

By providing the dislocation conversion layer having such a doping concentration, the layer can function not only as a dislocation conversion layer to perform BPD to TED conversion, but also as a recombination promotion layer to promote the recombination of minority carriers.

In a preferred mode of the present invention, the dislocation conversion layer has a thickness of 1 μm or more.

Thus, by forming a thicker dislocation conversion layer compared to the known dislocation conversion layer, the conversion rate of dislocations can be improved and the recombination of minority carriers can be promoted.

In a preferred mode of the present invention, the dislocation conversion layer has a conversion rate from the basal plane dislocation to the threading edge dislocation of more than 95%.

In a preferred mode of the present invention, the dislocation conversion layer has a conversion rate from the basal plane dislocation to the threading edge dislocation of 100%.

As described above, by achieving both a high conversion rate and a high doping concentration, the number of layers to be grown on the base substrate can be reduced as compared with the known method. This reduces the number of procedures and the cost of producing SiC substrates.

A preferred mode of the present invention further includes a base substrate and an epitaxial growth layer, in which the dislocation conversion layer is provided between the base substrate and the epitaxial growth layer, and the doping concentration of the dislocation conversion layer is higher than the doping concentration of the epitaxial growth layer.

The present invention also relates to a method for producing a SiC substrate. That is, the present invention that solves the aforementioned problems is a method for producing a SiC substrate that includes a crystal growth step in which a dislocation conversion layer having a doping concentration of $1\times10^{15}$ cm$^{-3}$ or more is grown under conditions that increase the terrace width.

In a preferred mode of the present invention, in the crystal growth step, crystals are grown in a SiC—C equilibrium vapor pressure environment.

In a preferred mode of the present invention, the crystal growth step is a step of crystal-growing on a surface where no macro-step bunching is formed.

The present invention also relates to a SiC semiconductor device. That is, the present invention for solving the above-described problem is a SiC semiconductor device including a dislocation conversion layer having a doping concentration of $1\times10^{15}$ cm$^{-3}$ or more.

In a preferred mode of the present invention, a dislocation conversion layer having a doping concentration of $1\times10^{17}$ cm$^{-3}$ or more is included.

In a preferred mode of the present invention, the dislocation conversion layer has a thickness of 1 μm or more.

In a preferred mode of the present invention, the dislocation conversion layer has a conversion rate from the basal plane dislocation to the threading edge dislocation of more than 95%.

In a preferred mode of the present invention, the dislocation conversion layer has a conversion rate from the basal plane dislocation to the threading edge dislocation of 100%.

A preferred mode of the present invention further includes a base substrate and an epitaxial growth layer, in which the dislocation conversion layer is provided between the base substrate and the epitaxial growth layer, and the doping concentration of the dislocation conversion layer is higher than the doping concentration of the epitaxial growth layer.

The present invention also relates to a method for producing a SiC semiconductor device. That is, the present invention that solves the aforementioned problems is a method for producing a SiC semiconductor device that includes a crystal growth step of growing a dislocation conversion layer having a doping concentration of $1\times10^{15}$ cm$^{-3}$ or more under conditions that increase the terrace width.

In a preferred mode of the present invention, in the crystal growth step, crystals are grown in a SiC—C equilibrium vapor pressure environment.

In a preferred mode of the present invention, the crystal growth step is a step of crystal-growing on a surface where no macro-step bunching is formed.

Advantageous Effects of Invention

The disclosed technology provides a novel technology for a SiC substrate having a dislocation conversion layer that can reduce resistance, and a SiC semiconductor.

The disclosed technology also provides a novel technology for producing a SiC substrate having a dislocation conversion layers that can reduce resistance, and a SiC semiconductor.

Other problems, features, and advantages will become apparent by reading the embodiments for implementing the present invention described below, when taken up together with the drawings and claims.

BRIEF DESCRIPTION OF DRAWINGS

FIG. 13 illustrates the method for determining the BPD to TED conversion rate.

DESCRIPTION OF EMBODIMENTS

Preferred embodiments of the SiC substrate, method for producing a SiC substrate, SiC semiconductor device, and method for producing a SiC semiconductor device according to the present invention will be described in detail with reference to the accompanying drawings below. The technical scope of the present invention is not limited to the embodiments depicted in the accompanying drawings, and may be modified as necessary within the scope of the claims.

In the present specification and the accompanying drawings, layers or regions marked with n or p mean that electrons or holes are the majority carriers. The + and − attached to n and p mean that the impurity concentration is higher and lower, respectively, than that of the layers or regions without such marks. The same notation for n and p, including + and −, indicates that the concentrations are close to each other and not necessarily equivalent. In the following description of the embodiments and accompanying drawings, similar configurations are marked with the same reference signs and redundant explanations are omitted.

<<SiC Substrate>>

Figure 1:
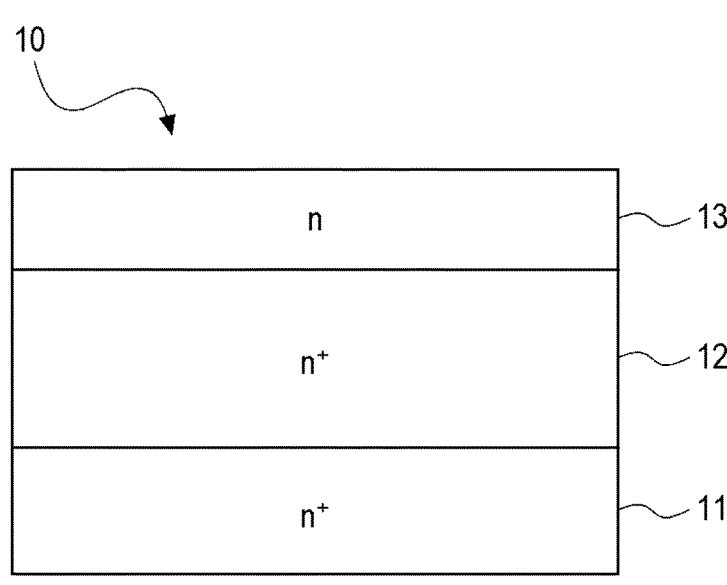
FIG. 1 is a cross-sectional view of the SiC substrate according to an embodiment.

FIG. 1 is a cross-sectional view illustrating the structure of a SiC substrate 10 according to an embodiment. As illustrated in FIG. 1, the SiC substrate 10 according to the embodiment includes a base substrate 11 which is an n+ type substrate, a dislocation conversion layer 12 which is an n+ type layer, and an epitaxial growth layer 13 which is an n type layer.

In the present specification, the surface of the SiC substrate 10 on which the semiconductor device is made (specifically, the surface on which the epitaxial growth layer 13 is deposited) is referred to as the main surface, and the surface facing the main surface is referred to as the back surface. The main surface and the back surface are collectively referred to as the surface.

An example of the main surface is a surface having an off-angle of a few degrees (for example, from 0.4 to 8°) from the (0001) or (000-1) plane. As used herein, in the notation of the Miller index, "-" means the bar to be affixed to an index coming immediately after the mark.

Usually, a step-terrace structure is formed on the surface of atomically planarized single crystal SiC. The step-terrace structure is a staircase structure in which steps 14 having a portion of level difference of one or more molecular layers, and terraces 15 having flat portions with the {0001} surface exposed are alternately arranged.

The step 14 has a minimum height (minimum unit) of one molecular layer (0.25 nm), and a plurality of layers of this single molecular layer form various step heights. In the present specification, bunching of the steps 14 that are so large that they exceed the height of one unit cell of each polytype is called macro-step bunching (MSB).

In other words, MSBs are the steps 14 that are bunched beyond 4 molecular layers (5 or more molecular layers) for 4H—SiC and beyond 6 molecular layers (7 or more molecular layers) for 6H—SiC.

The base substrate 11 may be a single crystal SiC processed into a plate shape. For example, it is a SiC wafer sliced from a SiC ingot produced by sublimation or other method. As for the crystal polymorphism of the single crystal SiC, any polytype may be used.

Normally, the base substrate 11 that has undergone mechanical processing (slicing and polishing/grinding) has a subsurface damaged layer 111 where processing damage has been introduced, and a bulk layer 112 having no such processing damage.

Figure 4:
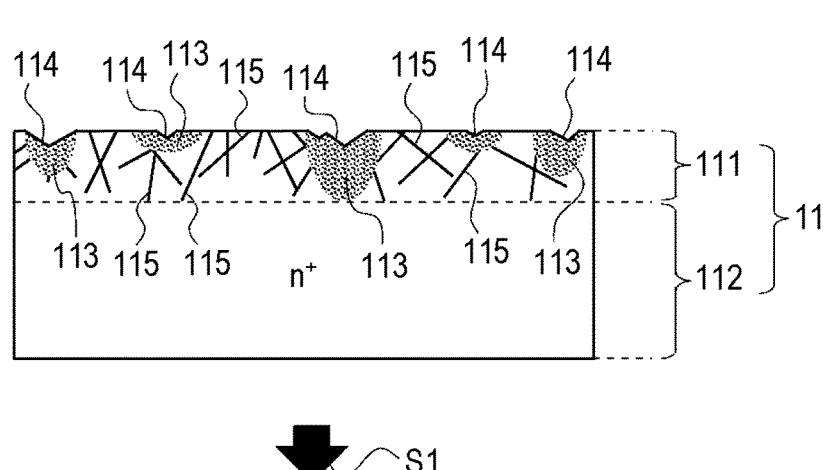
FIG. 4 illustrates the subsurface damaged layer removal step according to the present invention.
Figure 4:
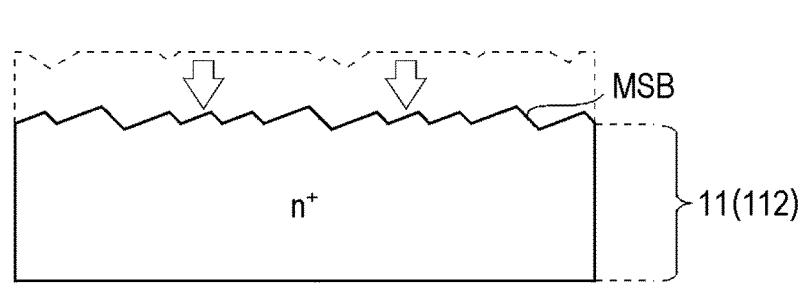
Figure 4:
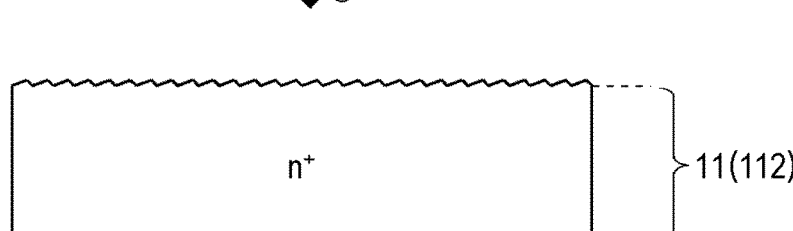

The subsurface damaged layer 111 includes, for example, strains 113, scratches 114, and latent flaws 115 (see FIG. 4). The presence or absence of the subsurface damaged layer 111 can be confirmed by, for example, SEM-EBSD, TEM, or μXRD.

The base substrate 11 is, for example, a nitrogen-doped SiC single crystal substrate. The doping concentration of the base substrate 11 is $1\times10^{17}$ cm$^{-3}$ or more, preferably $1\times10^{18}$ cm$^{-3}$ or more, and more preferably $1\times10^{19}$ cm$^{-3}$ or more.

The dislocation conversion layer 12 is, for example, a nitrogen-doped SiC layer. The doping concentration of the dislocation conversion layer 12 is $1\times10^{15}$ cm$^{-3}$ or more, preferably $1\times10^{16}$ cm$^{-3}$ or more, more preferably $1\times10^{17}$ cm$^{-3}$ or more, even more preferably $1\times10^{18}$ cm$^{-3}$ or more, and yet even more preferably $1\times10^{19}$ cm$^{-3}$ or more.

The BPD to TED conversion rate of the dislocation conversion layer 12 is more than 95.00%, preferably 96.00% or more, more preferably 97.00% or more, even more preferably 98.00% or more, and yet even more preferably 99.00% or more.

In other words, when the dislocation conversion layer 12 is grown on the main surface of the base substrate 11 having 5000 BPDs, the number of BPDs on the main surface of the dislocation conversion layer 12 is 250 or less. When the dislocation conversion layer 12 is grown on the main surface of the base substrate 11 having 10000 BPDs, the number of BPDs on the main surface of the dislocation conversion layer 12 is 500 or less.

When the dislocation conversion layer 12 is grown on the main surface of the base substrate 11 having 20000 BPDs, the number of BPDs on the main surface of the dislocation conversion layer 12 is 1000 or less.

The BPD to TED conversion rate of the dislocation conversion layer 12 is more than 99.95%, preferably 99.96% or more, more preferably 99.97% or more, even more preferably 99.98% or more, yet even more preferably 99.99% or more, and yet even more preferably 100%.

That is, it is preferable that all the BPDs on the base substrate 11 are converted to TEDs during the formation of the dislocation conversion layer 12, and no BPDs exist on the main surface of the dislocation conversion layer 12.

The thickness of the dislocation conversion layer 12 is 1 μm or more, preferably 3 μm or more, more preferably 5 μm or more, even more preferably 7 μm or more, and yet even more preferably 10 μm or more.

The epitaxial growth layer 13 is, for example, a nitrogen-doped SiC layer. The doping concentration of the epitaxial growth layer 13 is lower than that of the dislocation conversion layer 12. In other words, the doping concentration of the dislocation conversion layer 12 is higher than that of the epitaxial growth layer 13, resulting in lower resistance during device operation.

It is known that the presence of MSBs has a critical impact on the operating performance and reliability of MOSFETs, which are produced by forming an oxide film on the main surface of the epitaxial growth layer 13.

Therefore, it is preferable that the main surface of the epitaxial growth layer 13 has no MSBs. The main surface of the epitaxial growth layer 13 preferably has an array of the steps 14 having one unit cell height. The height of the steps 14 and the terrace width W can be confirmed by AFM and the method of evaluating SEM image contrast described in JP 2015-179082 A.

The SiC substrate 10 according to the present invention includes the dislocation conversion layer 12 having a doping concentration of $1\times10^{15}$ cm$^{-3}$ or more. Thus, by setting the dislocation conversion layer 12, which performs the BPD to TED conversion, to a higher doping concentration than the known n type dislocation conversion layer 102, the resistance of the SiC semiconductor device can be reduced.

The SiC substrate 10 according to the present invention also includes the dislocation conversion layer 12 having a doping concentration of $1\times10^{17}$ cm$^{-3}$ or more. That is, by setting the doping concentration higher than the epitaxial growth layer 13 to be formed, the recombination of minority carriers can be promoted. As a result, the dislocation conversion layer 12 can function as a recombination promotion layer in addition to dislocation conversion.

That is, the doping concentration of the dislocation conversion layer 12 is preferably higher than the doping concentration of the epitaxial growth layer 13.

The dislocation conversion layer 12 of the SiC substrate 10 according to the present invention has a thickness of 1 μm or more. This thickness of at least 1 μm can improve the BPD to TED conversion rate.

Furthermore, the thickness of 1 μm or more expands the region where minority carriers recombine, and increases the distance between the region where recombination is more frequent (the main surface side of the dislocation conversion layer 12) and the region where many BPDs exist (the back surface side of the dislocation conversion layer 12). Therefore, the energy generated by recombination can be suppressed from being given to the BPD.

Figure 17:
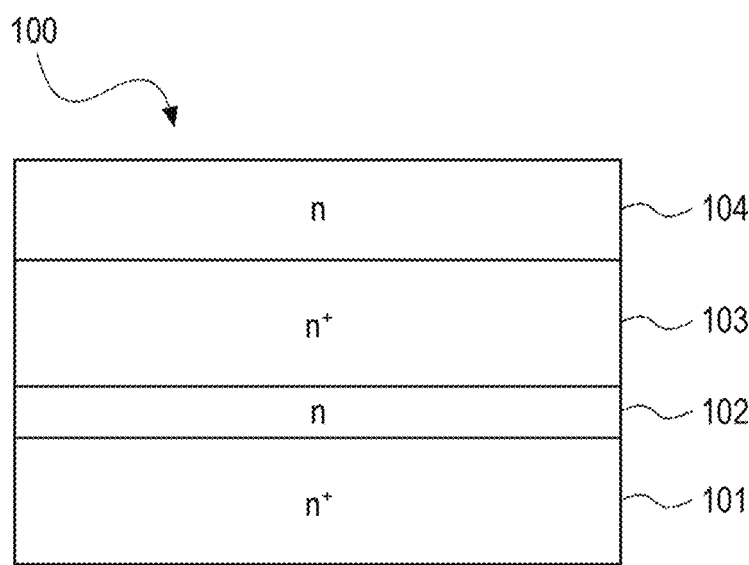
FIG. 17 is a cross-sectional view showing the structure of the SiC substrate that has undergone a known treatment to suppress stacking faults.

The SiC substrate 10 according to the present embodiment has a three-layer structure including the base substrate 11 which is an n+ type substrate, the dislocation conversion layer 12 which is an n+ type layer, and the epitaxial growth layer 13 which is an n type layer. On the other hand, the known SiC substrate 100 has a four-layer structure including an n+ type SiC base substrate 101, an n type dislocation conversion layer 102, an n+ type recombination promotion layer 103, and an n type epitaxial growth layer 104 (see FIG. 17). Compared to the known SiC substrate 100, the SiC substrate 10 according to the present embodiment can reduce the number of layers to be grown and the number of steps. This makes it possible to simplify growth conditions and reduce costs.

Figure 2:
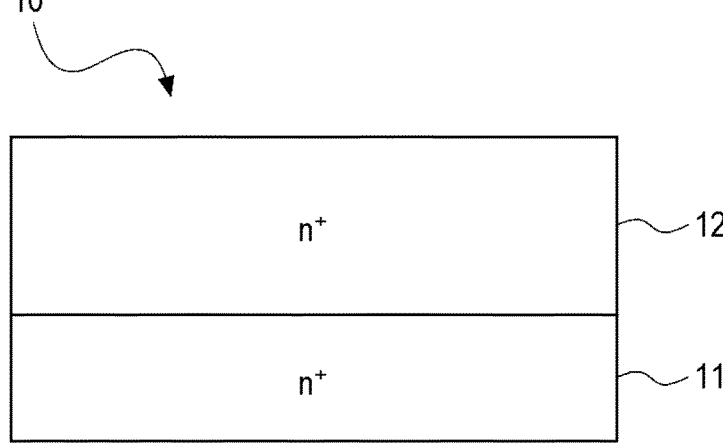
FIG. 2 is a cross-sectional view of a SiC substrate according to another embodiment.

FIG. 2 illustrates a cross-sectional view of the SiC substrate 10 according to another embodiment. As illustrated in FIG. 2, the SiC substrate 10 according to another embodiment is an epi-ready substrate including the base substrate 11, which is an n+ type layer, and the dislocation conversion layer 12, which is an n+ type layer.

In this manner, the SiC substrate 10 may be produced before the epitaxial growth layer 13 is formed.

When the epitaxial growth layer 13 is formed on the surface having MSBs, it is known that defects due to MSBs may occur in the epitaxial growth layer 13.

Therefore, the main surface of the dislocation conversion layer 12 preferably has no MSBs. In addition, the main surface of the dislocation conversion layer 12 preferably has an array of the steps 14 having one unit cell height.

In the present invention, the dislocation conversion layer 12 is an n+ type layer having a higher doping concentration than the n type dislocation conversion layer 102 of the SiC substrate 100 that has undergone known treatment to suppress stacking faults. In addition to suppressing the generation of SF, this new structure can achieve remarkable effects, such as reducing the resistance of SiC semiconductor devices, simplifying the structure of SiC substrates, and simplifying the process.

<<Method for Producing SiC Substrate>>

Figure 3:
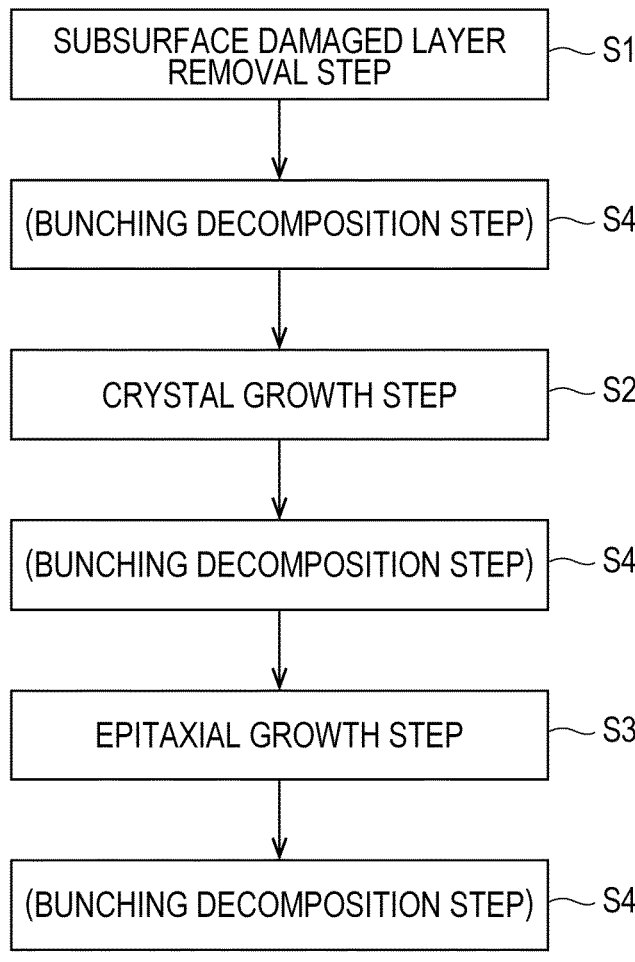
FIG. 3 illustrates the production process of the SiC substrate according to an embodiment.

Next, the method for producing a SiC substrate according to the present embodiment will be explained in detail. FIG. 3 illustrates the production process of a SiC substrate according to an embodiment.

The method for producing a SiC substrate according to the present embodiment includes a subsurface damaged layer removal step S1 of removing the subsurface damaged layer 111 of the base substrate 11, a crystal growth step S2 of growing the dislocation conversion layer 12 having a doping concentration of $1 \times 10^{15}$ cm$^{-3}$ or more under conditions that increase the terrace width W, and an epitaxial growth step S3 of growing the epitaxial growth layer 13.

The subsurface damaged layer removal step S1 may be followed by a bunching decomposition step S4 of removing the MSBs formed on the main surface of the base substrate 11. The crystal growth step S2 may be followed by the bunching decomposition step S4 of removing the MSBs formed on the main surface of the dislocation conversion layer 12. The epitaxial growth step S3 may be followed by the bunching decomposition step S4 of removing the MSBs formed on the main surface of the epitaxial growth layer 13.

Each step is described in detail below.

The bunching decomposition step S4 may be performed in any order, using a common method. Therefore, the bunching decomposition step S4 will be described after the subsurface damaged layer removal step S1, the crystal growth step S2, and the epitaxial growth step S3.

<Subsurface Damaged Layer Removal Step>

FIG. 4 illustrates the subsurface damaged layer removal step S1 according to the present invention. The subsurface damaged layer removal step S1 is a step of removing the subsurface damaged layer 111 that has been introduced into the n+ type base substrate 11.

The subsurface damaged layer removal step S1 may be performed by any method that can remove the subsurface damaged layer 111. Examples of the method include Si-vapor etching (SiVE) for etching single crystal SiC by heating under Si-vapor pressure, hydrogen etching using hydrogen gas as an etching gas, and chemical mechanical polishing (CMP).

The following is a detailed description of the preferred embodiment of the present step.

Figure 5:
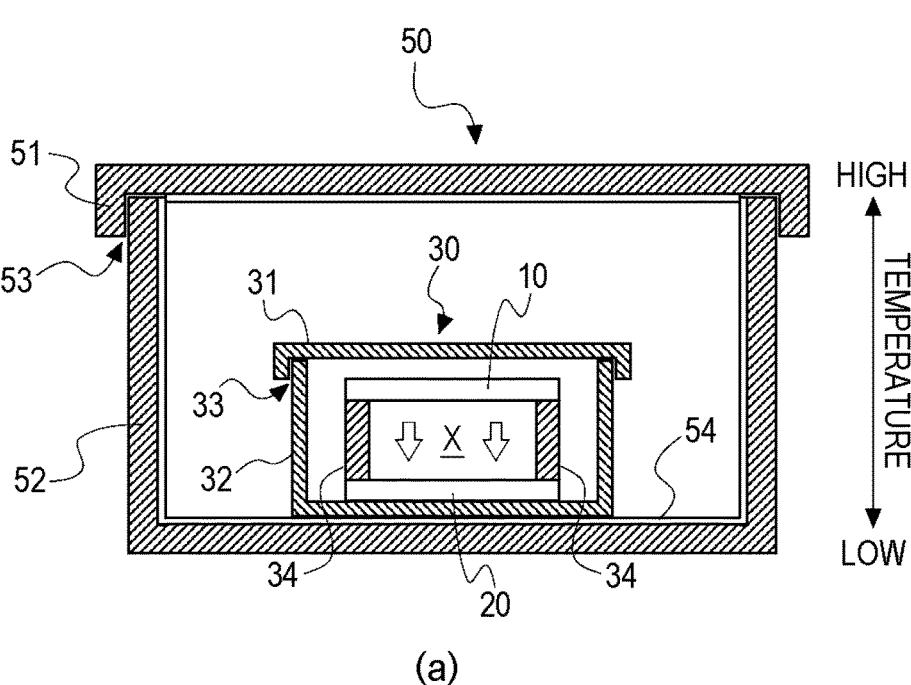
FIG. 5 illustrates the subsurface damaged layer removal step according to an embodiment.
Figure 5:
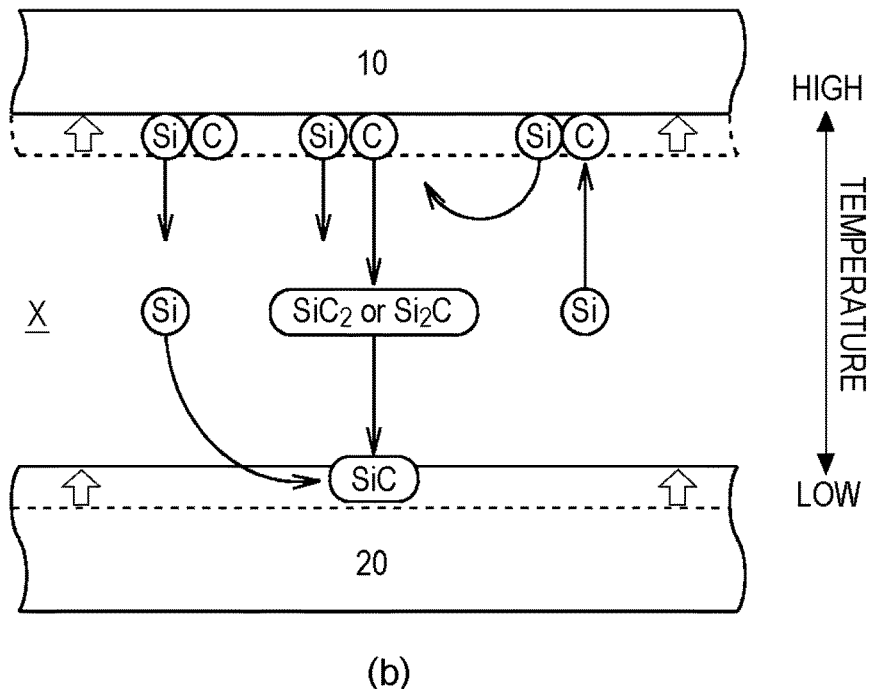

FIG. 5 illustrates the subsurface damaged layer removal step S1 according to an embodiment.

The subsurface damaged layer removal step S1 according to the present embodiment is a step of housing the SiC substrate 10 in a semi-closed space containing Si and C element supply sources, and heating it for etching.

The "semi-closed space" in the present description refers to a space in which at least a portion of the vapor generated in the container can be confined, although the vacuation in the container and the supply of dopant gas to the container are still possible. This semi-closed space can be formed in the main container 30 or in the refractory material container 50, as described below.

Specifically, the subsurface damaged layer removal step S1 is a step of disposing the SiC substrate 10 to face the SiC material body 20 in the main container 30 where the SiC material body 20 (Si element supply source and C element supply source) is exposed, and performing heat treatment (see FIG. 5(a)).

By placing the SiC substrate 10 and the SiC material body 20, which has a lower temperature than that of the SiC substrate 10, to face each other, an etching space X is formed between them.

In the etching space X, the temperature gradient formed by the heating furnace 40 drives the transport of atoms, resulting in the etching of the SiC substrate 10.

By controlling the atomic number ratio Si/C in the main container 30, heat treatment in a SiC—Si equilibrium vapor pressure environment or a SiC—C equilibrium vapor pressure environment can be selected.

As used herein, the term "SiC—Si-vapor pressure environment" refers to the vapor pressure environment when SiC (solid) and Si (liquid phase) are in phase equilibrium through a vapor phase.

The SiC—Si equilibrium vapor pressure environment is formed by heat-treating a semi-closed space having an atomic number ratio Si/C of more than 1. Specifically, when the SiC substrate 10 satisfying a stoichiometric ratio of 1:1, the SiC material body 20 satisfying a stoichiometric ratio of 1:1, and the Si-vapor supply source 35 (for example, Si pellets) are placed in the SiC main container 30 satisfying a stoichiometric ratio of 1:1, the atomic number ratio Si/C in the main container 30 exceeds 1.

As used herein, the term "SiC—C equilibrium vapor pressure environment" refers to the environment of vapor pressure when SiC (solid phase) and C (solid phase) are in phase equilibrium through a vapor phase.

The SiC—C equilibrium vapor pressure environment is formed by heat-treating a semi-closed space having an atomic number ratio Si/C of 1 or less. Specifically, when SiC substrate 10 satisfying a stoichiometric ratio of 1:1 and the SiC material body 20 satisfying a stoichiometric ratio of 1:1 are placed in the SiC main container 30 satisfying a stoichiometric ratio of 1:1, the atomic number ratio Si/C in the main container 30 is 1 (see FIG. 5(*a*)). A C vapor supply source (for example, C pellets) may be placed to make the atomic number ratio Si/C 1 or less.

The subsurface damaged layer removal step S1 is also a step of placing the main container 30 described above in the refractory material container 50 where the Si-vapor supply source 54 is exposed, and heating the main container 30 (see FIG. 5(*a*)).

Thus, by placing and heating the main container 30 together with the Si-vapor supply source 54 in the refractory material container 50 that forms a semi-closed space, the evacuation of the gas phase species containing Si elements from the main container 30 is suppressed. That is, the environment inside the main container 30 can be maintained by balancing the vapor pressure of the gas phase species containing Si elements inside the main container 30 and the vapor pressure of the gas phase species containing Si elements outside the main container 30.

The SiC material body 20 includes SiC that can receive or pass Si and C elements to and from the SiC substrate 10 by being placed opposite to the SiC substrate 10 and being heat-treated. For example, it may be a container made of SiC (the main container 30) or a substrate made of SiC (a SiC material substrate). As for the crystal polymorphism of the SiC material body 20, any polytype may be used, and polycrystalline SiC may be used.

The SiC material body 20 may be a sintered body made by sintering Si and C element supply sources.

The driving force for transporting Si and C elements in this etching may be the temperature gradient or chemical potential difference between the SiC substrate 10 and the SiC material body 20.

In the subsurface damaged layer removal step S1 according to the present embodiment, the SiC substrate 10 and the SiC material body 20 are placed facing each other and heated in the temperature range of 1400° C. to 2300° C. so that the SiC substrate 10 is on the high temperature side and the SiC material body 20 is on the low temperature side.

As a result, the following reactions 1) through 5) are continuously performed, and as a result, the etching of SiC substrate 10 is considered to progress. (See FIG. 5 (*b*)).

$$SiC(s) \rightarrow Si(v) + C(s) \qquad 1)$$

$$2C(s) + Si(v) \rightarrow SiC_2(v) \qquad 2)$$

$$C(s) + 2Si(v) \rightarrow Si_2C(v) \qquad 3)$$

$$Si(v) + SiC_2(v) \rightarrow 2SiC(s) \qquad 4)$$

$$Si_2C(v) \rightarrow Si(v) + SiC(s) \qquad 5)$$

1): Si atoms (Si(v)) are desorbed from the surface of the SiC substrate 10 by pyrolysis due to heating of the SiC substrate 10 (SiC(s)) (Si atom sublimation step).

2) and 3): Due to the desorption of Si atoms (Si(v)), the remaining C atoms (C(s)) on the SiC substrate 10 surface react with Si-vapor (Si(v)) in the semi-closed space. As a result, the C atoms (C(s)) sublimate from the surface of the SiC substrate 10 as $Si_2C$, $SiC_2$, or the like (C atom sublimation step).

4) and 5): The sublimated $Si_2C$, $SiC_2$, or the like reaches the SiC material body 20 in the semi-closed space by the temperature gradient and is crystal-grown.

As described above, the subsurface damaged layer removal step S1 according to the present embodiment includes the Si atom sublimation step of thermally subliming Si atoms from the surface of the SiC substrate 10, and the C atom sublimation step of sublimating C atoms remaining on the surface of the SiC substrate 10 from the surface of the SiC substrate 10 by reacting the C atoms with Si-vapor in the semi-closed space.

The etching temperature according to the present embodiment is preferably set in the range of 1400 to 2300° C.

The etching rate according to the present embodiment can be controlled by the aforementioned temperature range, and may be selected in the range of 0.001 to 2 μm/min.

The etching time according to the present embodiment may be set to any time to achieve the desired etching amount. For example, when the etching rate is 1 μm/min and the etching amount is desired to be 1 the etching time is 1 minute.

The temperature gradient according to the present embodiment is set in the range of, for example, from 0.1 to 5° C./mm.

It is also possible to introduce inert gas during etching. This inert gas may be, for example, Ar, He, or $N_2$, and by introducing it in the range of $10^{-5}$ to 10000 Pa, the degree of vacuum in the heating furnace 40 (main heating chamber 41) can be adjusted.

The subsurface damaged layer removal step S1 may be followed by a bunching decomposition step S4 of removing MSBs formed on the surface of the base substrate 11.

In the subsurface damaged layer removal step S1, when the main surface of the SiC substrate 10 is etched in a SiC—Si-vapor pressure environment that does not for MSBs on the surface, the bunching decomposition step S4 may be omitted. In other words, the subsurface damaged layer removal step S1 and the bunching decomposition step S4 may be performed simultaneously.

<Crystal Growth Step>

Figure 6:
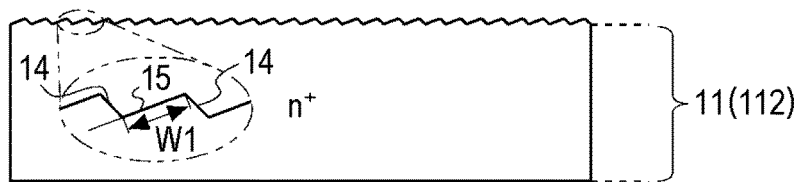
FIG. 6 illustrates the crystal growth step according to the present invention.
Figure 6:
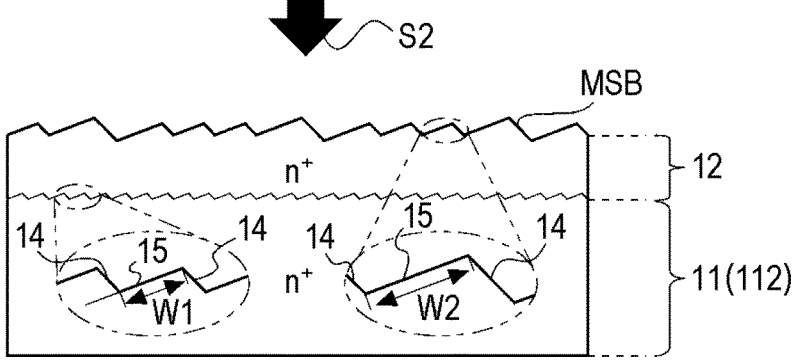
Figure 6:
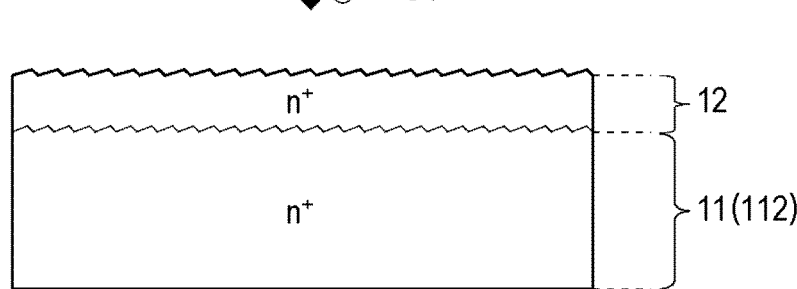

FIG. 6 illustrates the crystal growth step S2 according to the present invention. The crystal growth step S2 is a step of growing the n+ type dislocation conversion layer 12 on the n+ type base substrate 11 under the conditions that increase the terrace width W.

Thus, by growing the dislocation conversion layer 12 under conditions that increase the terrace width W, both a high BPD to TED conversion rate and a high doping concentration can be achieved. Examples of the conditions that increase the terrace width W include a SiC—C equilibrium vapor pressure environment and a C-rich environment.

Therefore, the crystal growth step S2 may be any method that enables the crystal growth of the SiC substrate 10 in a SiC—C equilibrium vapor pressure environment or a C-rich environment. Examples of the method include sublimation and chemical vapor deposition (CVD).

The following is a detailed description of the preferred embodiment of the present step.

Figure 7:
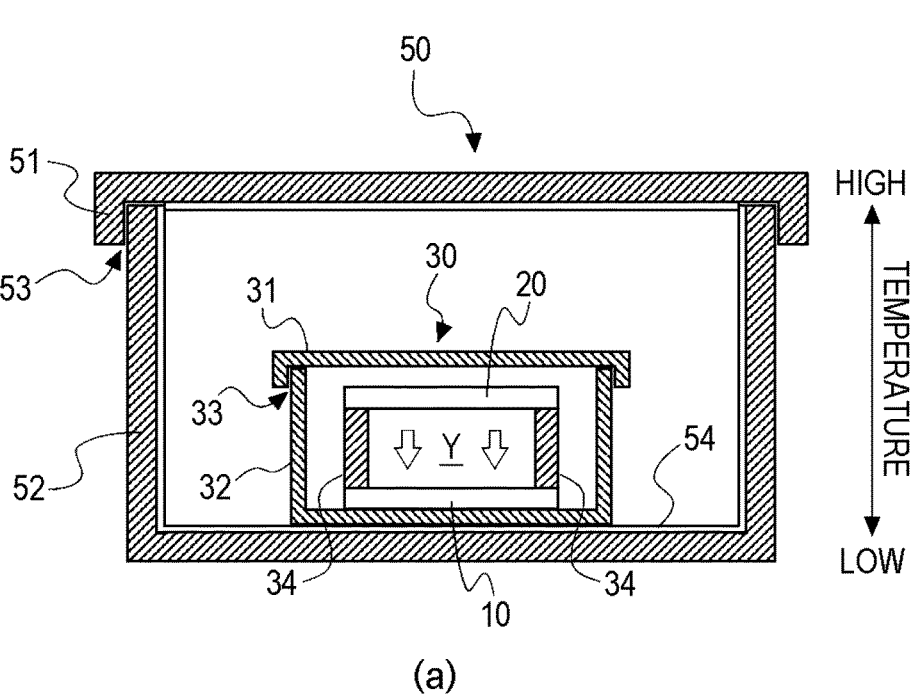
FIG. 7 illustrates the crystal growth step according to an embodiment.
Figure 7:
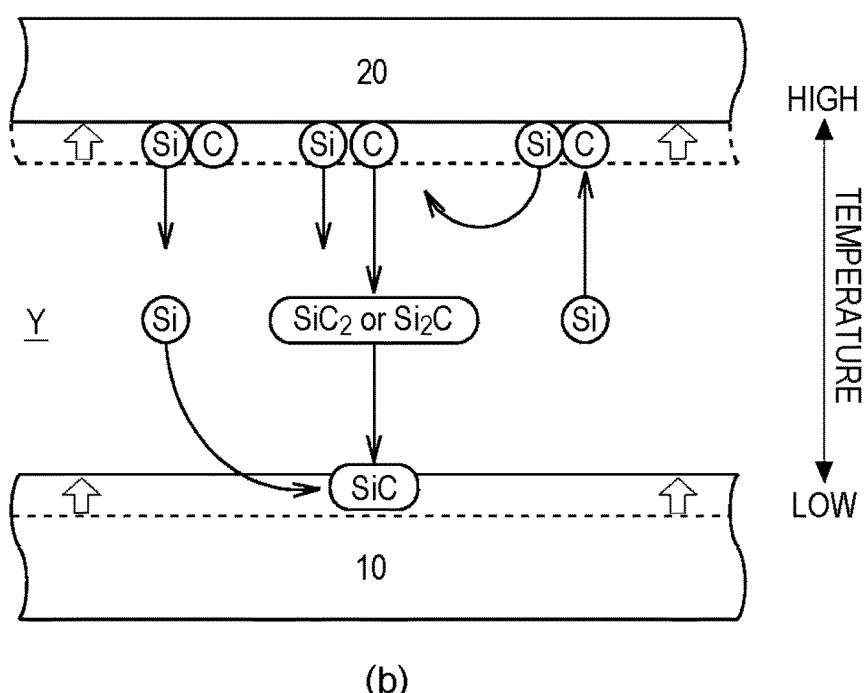

FIG. 7 illustrates the crystal growth step S2 according to an embodiment.

The crystal growth step S2 according to the present embodiment is a step of housing the SiC substrate 10 in a semi-closed space containing Si and C element supply sources, and heating it for crystal growth (see FIG. 7 (a)).

Specifically, the crystal growth step S2 is, similarly to the subsurface damaged layer removal step S1, a step of placing the SiC substrate 10 to face the SiC material body 20 in the main container 30 where the SiC material body 20 (Si element supply source and C element supply source) is exposed, and performing heat treatment (see FIG. 7(b)).

The subsurface damaged layer removal step S1 described above is a step of transporting Si and C elements from the SiC substrate 10 to the SiC material body 20 to etch the SiC substrate 10.

On the contrary, the crystal growth step S2 is a step of transporting Si and C elements from the SiC material body 20 to the SiC substrate 10 to crystal-grow the SiC substrate 10.

By placing the SiC substrate 10 and the SiC material body 20, which has a lower temperature than the SiC substrate 10, to face each other, a crystal growth space Y is formed between them.

In the crystal growth space Y, the temperature gradient formed by the heating furnace 40 drives the transport of atoms, resulting in the crystal growth on the SiC substrate 10.

The crystal growth step S2 is a step of growing the dislocation conversion layer 12 in a SiC—C equilibrium vapor pressure environment. Therefore, a semi-closed space having an atomic number ratio Si/C of 1 or less is formed by heat treatment.

That is, the crystal growth step S2 is a step of placing the SiC substrate 10 and the SiC material body 20 to face each other in a semi-closed space having an atomic number ratio Si/C of more than 1, and performing heat treatment so as to form a temperature gradient between the SiC substrate 10 and the SiC material body 20.

In the crystal growth step S2, as in the subsurface damaged layer removal step S1, the main container 30 is placed in the refractory material container 50 where the Si-vapor supply source 54 is exposed, whereby the environment inside the main container 30 is maintained.

In the crystal growth step S2 according to the present embodiment, the SiC substrate 10 and the SiC material body 20 are placed facing each other and heat treatment is performed in the temperature range of 1400° C. to 2300° C. such that the SiC substrate 10 is on the low temperature side and the SiC material body 20 is on the high temperature side.

As a result, the following reactions 1) to 5) are continuously performed, and as a result, the crystal growth of SiC substrate 10 is considered to progress. (See FIG. 7(b)).

$$\text{Poly-SiC}(s) \rightarrow \text{Si}(v) + \text{C}(s) \qquad 1)$$

$$2\text{C}(s) + \text{Si}(v) \rightarrow \text{SiC}_2(v) \qquad 2)$$

$$\text{C}(s) + 2\text{Si}(v) \rightarrow \text{Si}_2\text{C}(v) \qquad 3)$$

$$\text{Si}(v) + \text{SiC}_2(v) \rightarrow 2\text{SiC}(s) \qquad 4)$$

$$\text{Si}_2\text{C}(v) \rightarrow \text{Si}(v) + \text{SiC}(s) \qquad 5)$$

Si atoms (Si(v)) are desorbed from SiC by pyrolysis caused by heating of the SiC material (poly-SiC(s)).

2) and 3): Due to the desorption of Si atoms (Si(v)), the remaining C atoms (C(s)) react with Si-vapor (Si(v)) in the semi-closed space. As a result, the C atoms (C(s)) sublimate in the semi-closed space as $\text{Si}_2\text{C}$, $\text{SiC}_2$, or the like.

4) and 5): The sublimated $\text{Si}_2\text{C}$, $\text{SiC}_2$, or the like reaches and diffuses into the terraces of the SiC substrate 10 due to the temperature gradient (or chemical potential difference) and reaches the steps, and grows by taking over the polymorphism of the base SiC substrate 10 (step-flow growth).

At this time, the dopants of the SiC material body 20 are transported together with the source materials (Si and C elements), so that the dislocation conversion layer 12 that takes over the doping concentration of the SiC material body 20 grows.

Therefore, by selecting the type of the dopant and the doping concentration of the SiC material body 20, the dopant and doping concentration of the dislocation conversion layer 12 can be controlled.

That is, when it is desired to obtain the dislocation conversion layer 12 having a nitrogen doping concentration of $1 \times 10^{15}$ cm$^{-3}$ or more, the SiC material body 20 having a nitrogen doping concentration of $1 \times 10^{15}$ cm$^{-3}$ or more should be used. When it is desired to obtain the dislocation conversion layer 12 having a nitrogen doping concentration of $1 \times 10^{17}$ cm$^{-3}$ or more, the SiC material body 20 having a nitrogen doping concentration of $1 \times 10^{17}$ cm$^{-3}$ or more should be used.

Therefore, the doping concentration of the SiC material body 20 is $1 \times 10^{15}$ cm$^{-3}$ or more, preferably $1 \times 10^{16}$ cm$^{-3}$ or more, more preferably $1 \times 10^{17}$ cm$^{-3}$ or more, even more preferably $1 \times 10^{18}$ cm$^{-3}$ or more, and yet even more preferably $1 \times 10^{19}$ cm$^{-3}$ or more.

The doping may be performed by supplying a dopant gas during the heat treatment.

The growth temperature according to the present embodiment is preferably set in the range of 1400 to 2300° C.

The growth rate according to the present embodiment can be controlled by the aforementioned temperature range, and may be selected in the range of 0.001 to 2 μm/min.

The growth time according to the present embodiment may be set to any time to achieve the desired growth amount. For example, when the growth rate is 1 μm/min and the growth amount is desired to be 1 μm, the growth amount is 1 minute.

The temperature gradient according to the present embodiment is set in the range of 0.1 to 5° C./mm.

In this method, a dopant gas (such as $\text{N}_2$) may be supplied and introduced into the main heating chamber 41 in the range of $10^{-5}$ to 10000 Pa.

In the crystal growth step S2, crystals are preferably grown on the surface having no MSBs. Therefore, in the subsurface damaged layer removal step S1, the main surface of SiC substrate 10 is preferably etched in a SiC—Si-vapor pressure environment that does not form MSBs on the surface.

In the subsurface damaged layer removal step S1, when etching is performed under the condition that forms MSBs on the main surface of the SiC substrate 10, it is desirable to perform the bunching decomposition step S4 described below before the crystal growth step S2.

The crystal growth step S2 may be followed by the bunching decomposition step S4 of removing the MSBs on the surface of the dislocation conversion layer 12.

<Epitaxial Growth Step>

Figure 8:
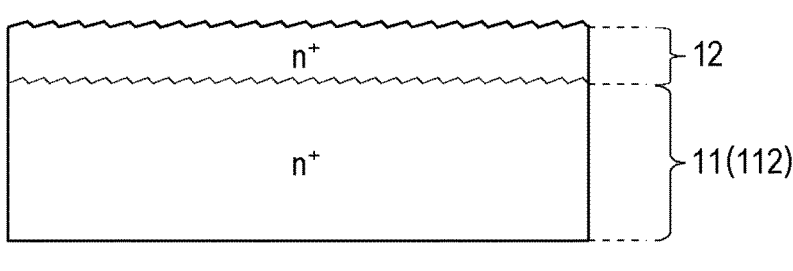
FIG. 8 illustrates the epitaxial growth step according to the present invention.
Figure 8:
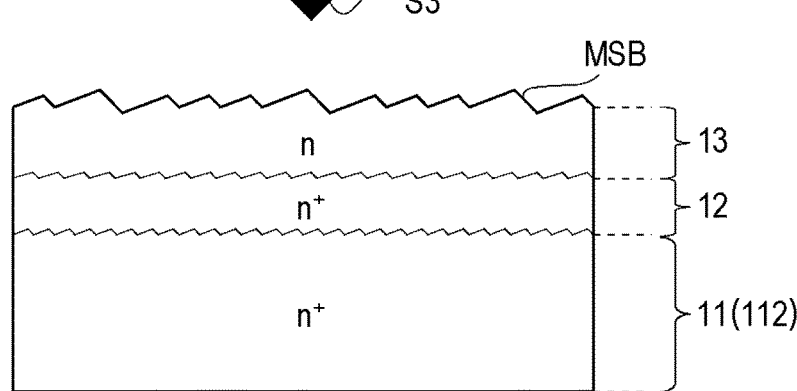
Figure 8:
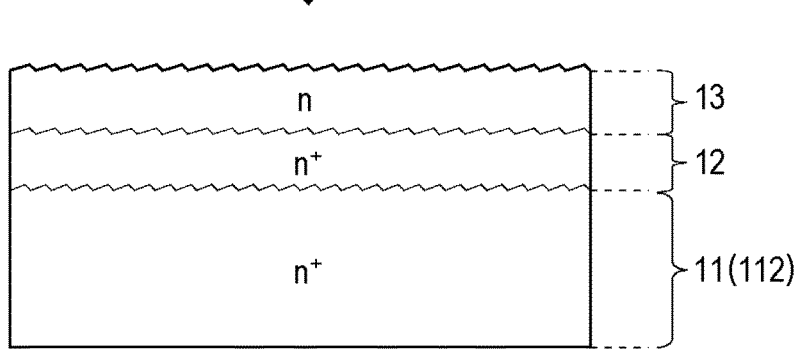

FIG. 8 illustrates the epitaxial growth step S3 according to the present invention. The epitaxial growth step S3 is a step of growing the n type epitaxial growth layer 13 on the dislocation conversion layer 12.

The epitaxial growth step S3 may be any method that can grow the epitaxial growth layers 13. Examples of the method include chemical vapor deposition (CVD), physical vapor transport (PVT), and metastable solvent epitaxy (MSE).

The following is a detailed description of the preferred embodiment of the present step.

The epitaxial growth step S3 according to the present embodiment is, as the crystal growth step S2, a step of housing the SiC substrate 10 in a semi-closed space containing Si and C element supply sources, and heating it for crystal growth.

Specifically, in the crystal growth step S2, the SiC substrate 10 and the SiC material body 20 are placed facing each other and heated in the temperature range of 1400° C. to 2300° C. so that the SiC substrate 10 is on the low temperature side and the SiC material body 20 is on the high temperature side (see FIG. 7).

The epitaxial growth step S3 is a step of crystal-growing the epitaxial growth layer 13, which is an n type layer and has a lower doping concentration than the dislocation conversion layer 12, which is an n+ type layer.

Therefore, the doping concentration of the SiC material body 20 used in the epitaxial growth step S3 is $1 \times 10^{17}$ cm$^{-3}$ or less, preferably $1 \times 10^{16}$ cm$^{-3}$ or less, and more preferably $1 \times 10^{15}$ cm$^{-3}$ or less.

The growth temperature according to the present embodiment is preferably set in the range of 1400 to 2300° C.

The growth rate according to the present embodiment can be controlled by the aforementioned temperature range, and may be selected in the range of 0.001 to 2 μm/min.

The growth time according to the present embodiment may be set to any time to achieve the desired growth amount. For example, when the growth rate is 1 μm/min and the growth amount is desired to be 1 the growth amount is 1 minute.

The temperature gradient according to the present embodiment is set in the range of 0.1 to 5° C./mm.

The epitaxial growth step S3 is also a step of growing crystals on the surface having no MSBs. Therefore, it is preferable to perform the bunching decomposition step S4 described later before the epitaxial growth step S3.

The epitaxial growth step S3 may be followed by the bunching decomposition step S4 of removing the MSBs formed on the surface of the epitaxial growth layer 13.

<Bunching Decomposition Step>

The bunching decomposition step S4 may be any method that can decompose the MSBs on the surface of the SiC substrate 10. Examples of the method include Si-vapor etching (SiVE) for etching single crystal SiC by heating under a Si-vapor pressure.

The following is a detailed description of the preferred embodiment of the present step.

Figure 9:
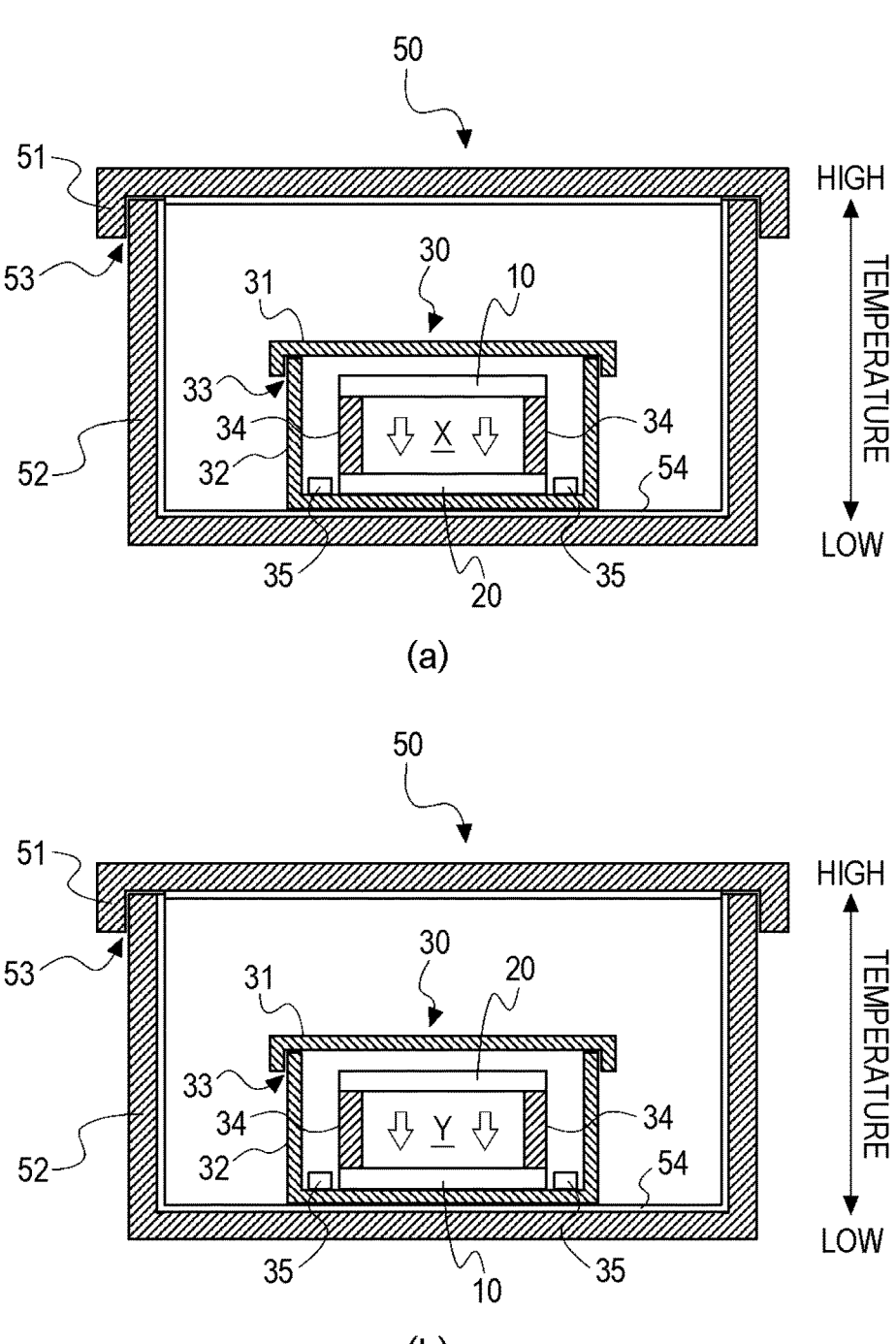
FIG. 9 illustrates the epitaxial growth step according to an embodiment.

FIG. 9 illustrates the bunching decomposition step S4 according to an embodiment.

The bunching decomposition step S4 according to the present embodiment is a step of housing the SiC substrate 10 in a semi-closed space containing Si and C element supply sources, and etching or crystal-growing it in a SiC—Si equilibrium vapor pressure environment.

Specifically, the bunching decomposition step S4 is, similarly to the subsurface damaged layer removal step S1 and the crystal growth step S2, a step of placing the SiC substrate 10 and the Si-vapor supply source 35 to face the SiC material body 20 in the main container 30 where the SiC material body 20 (Si element supply source and C element supply source) is exposed, and heat treatment is performed (see FIG. 9).

Furthermore, as in the subsurface damaged layer removal step S1 and the crystal growth step S2, the main container 30 is placed inside the refractory material container 50 where the Si-vapor supply source 54 is exposed, and heated to maintain the environment inside the main container 30.

FIG. 9(*a*) illustrates the decomposition of MSBs on the surface of the SiC substrate 10 by etching in a SiC—Si equilibrium vapor pressure environment.

That is, the SiC substrate 10 and the SiC material body 20 are placed in a semi-closed space having an atomic number ratio Si/C of more than 1, and are heated so that the SiC substrate 10 is on the high temperature side and the SiC material body 20 is on the low temperature side.

On the other hand, FIG. 9(*b*) illustrates an embodiment of decomposition of MSBs formed on the surface of the SiC substrate 10 by crystal growth in a SiC—Si equilibrium vapor pressure environment.

That is, the SiC substrate 10 and the SiC material body 20 are placed in a semi-closed space having an atomic number ratio Si/C of more than 1, and are heated so that the SiC substrate 10 is on the low temperature side and the SiC material body 20 is on the high temperature side.

By the bunching decomposition step S4 of the present embodiment, the MSBs on the surface of the SiC substrate 10 can be decomposed by heat-treating the SiC substrate 10 in a SiC—Si equilibrium vapor pressure environment.

The etching and growth conditions may be the same as those described in the subsurface damaged layer removal step S1 or the crystal growth step S2.

<SiC Substrate Producing Apparatus>

Next, the producing apparatus for achieving the method for producing a SiC substrate described above.

Figures 10, 11:
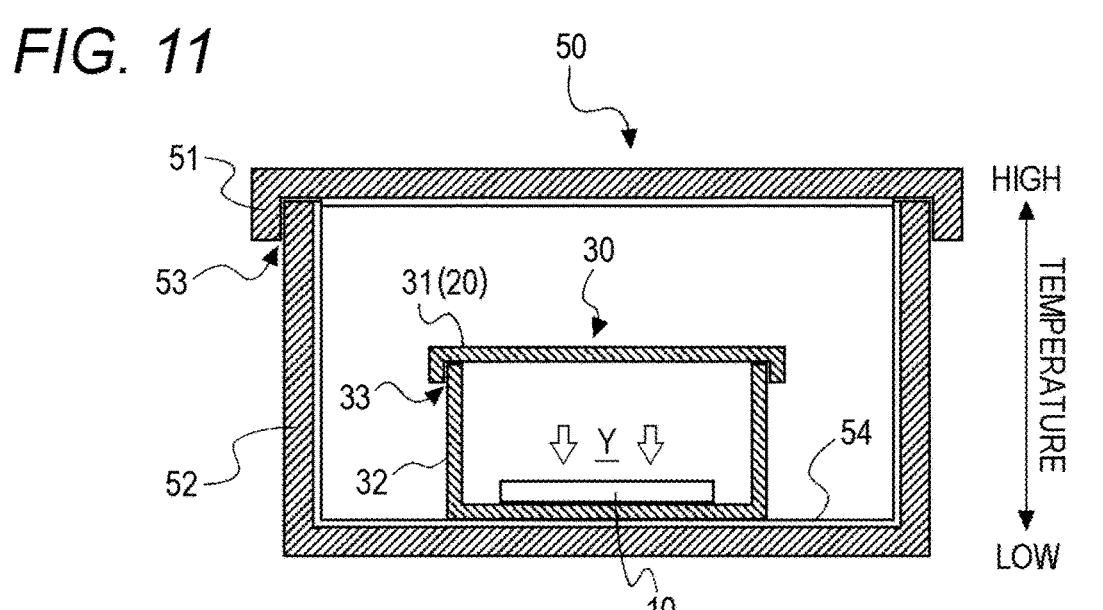
FIG. 10 illustrates the producing apparatus for SiC substrates according to an embodiment.
FIG. 11 illustrates the producing apparatus for SiC substrates according to Example 1.

As illustrated in FIG. 10, the SiC substrate producing apparatus according to the present embodiment includes the main container 30 capable of housing the SiC substrate 10, and the heating furnace 40 capable of heating the SiC substrate 10 and the SiC material body 20 so as to form a temperature gradient between them.

(Main Container)

The main container 30 is a fitting container including an upper container 31 and a lower container 32 that can be fitted to each other. A minute gap 33 is formed at the fitting part of the upper container 31 and the lower container 32, through which the inside of the main container 30 can be evacuated (vacuated).

The upper container 31 and the lower container 32 according to the present embodiment include polycrystalline SiC. Therefore, the main container 30 itself may be used as the SiC material body 20. Alternatively, only the portion of the main container 30 that faces the SiC substrate 10 may be made of the SiC material body 20. In this case, a high-melting point material (similar to the refractory material container 50 described below) may be used for portions other than the SiC material body 20.

As illustrated in FIGS. 5, 7, and 9, the SiC material body 20 in the form of a substrate may be housed separately. In this case, a spacer (such as a substrate holder 34) may be placed between the SiC material body 20 in the form of a substrate and the SiC substrate 10 to form an etching space X or a crystal growth space Y. The substrate holder 34 preferably includes the same high-melting point material as the refractory material container 50.

That is, the main container 30 is configured to generate an atmosphere containing Si and C elements in the internal space when heated with the SiC substrate 10 contained. In the present embodiment, an atmosphere containing Si and C elements is formed in the internal space by heating the SiC material body 20 including polycrystalline SiC.

The space inside the heated main container 30 is preferably a vapor pressure environment of a mixture of a gas phase species containing Si elements and a gas phase species containing C element. Examples of the gas phase species containing Si elements include Si, $Si_2$, $Si_3$, $Si_2C$, $SiC_2$, and SiC. Examples of the gas phase species containing C elements include $Si_2C$, $SiC_2$, SiC, and C. That is, the SiC-based gas is preferably exists in a semi-closed space.

The etching space X or the crystal growth space Y is a space that transports source materials from the SiC substrate 10 to the SiC material body 20 using the temperature gradient between the SiC substrate 10 and the SiC material body 20 as a driving force, and also transports source materials from the SiC material body 20 to the SiC substrate 10.

For example, the SiC substrate 10 is arranged so that the temperature on the SiC substrate 10 side is higher and the temperature of the SiC material body 20 is lower in the comparison between the temperature of the surface of the SiC substrate 10 and the temperature of the SiC material body 20 which faces the surface of the SiC substrate 10 (see FIG. 9(a)). When the SiC substrate 10 and the SiC material body 20 are placed facing each other and heated so that the SiC substrate 10 is on the high temperature side and the SiC material body 20 is on the low temperature side, the source materials are transported from the SiC substrate 10 to the SiC material body 20, and the SiC substrate 10 is etched. That is, the etching space X is formed between the SiC material body 20 and the SiC substrate 10.

In other case, the SiC substrate 10 is placed so that the temperature on the SiC substrate 10 side is lower and the temperature of the SiC material body 20 is higher in the comparison between the temperature of the surface of the SiC substrate 10 and the temperature of the SiC material body 20 which faces the surface of the SiC substrate 10 (see FIG. 9(b)). When the SiC substrate 10 and the SiC material body 20 are placed facing each other and heated so that the SiC substrate 10 is on the low temperature side and the SiC material body 20 is on the high temperature side, the source material is transported from the SiC material body 20 to the SiC substrate 10, and single crystal SiC grows on the SiC substrate 10. That is, the crystal growth space Y is formed between the SiC material body 20 and the SiC substrate 10.

(Heating Furnace)

As illustrated in FIG. 10, the heating furnace 40 includes a main heating chamber 41 capable of heating the object to be treated (for example, the SiC substrate 10) to a temperature of 1000° C. to 2300° C., a preheating chamber 42 capable of preheating the object to be treated to a temperature of 500° C. or higher, a refractory material container 50 capable of housing the main container 30, and a moving means 43 (moving table) capable of moving the refractory material container 50 from the preheating chamber 42 to the main heating chamber 41.

The main heating chamber 41 is regular hexagonal in planar cross-sectional view, and the refractory material container 50 is placed inside it.

Heaters 44 (mesh heaters) are provided inside the main heating chamber 41. Multilayer heat-reflective metal plates are fixed to the side walls and ceiling of the main heating chamber 41 (not illustrated.). The multilayer heat-reflective metal plates are configured to reflect the heat of the heaters 44 toward the substantially central portion of the main heating chamber 41.

As a result, in the main heating chamber 41, the heaters 44 are placed to surround the refractory material container 50 in which the object to be treated is housed, and the multilayer heat-reflective metal plate is placed outside the heater 44 to increase the temperature to the temperature range of 1000° C. to 2300° C.

The heaters 44 may be of, for example, resistance heating type or high-frequency induction heating type.

The heaters 44 may be configured to form a temperature gradient in the refractory material container 50. For example, the heaters 44 may be configured so that more heaters are placed on the upper side. The heaters 44 may be configured so that the width increases toward the upper side. Alternatively, the heaters 44 may be configured to be able to increase the power supplied toward the upper side.

The main heating chamber 41 is connected to a vacuum formation valve 45 for evacuating air from the main heating chamber 41, an inert gas injection valve 46 for introducing an inert gas into the main heating chamber 41, and a vacuum gauge 47 for measuring the degree of vacuum in the main heating chamber 41.

The vacuum formation valve 45 is connected to a vacuum pump (not illustrated) that evacuates air and vacuates the main heating chamber 41. By using the vacuum formation valve 45 and the vacuum pump, the degree of vacuum in the main heating chamber 41 can be adjusted to 10 Pa or less, more preferably to 1 Pa or less, and even more preferably to $10^{-3}$ Pa or less. Examples of the vacuum pump include a turbo molecular pump.

The inert gas injection valve 46 is connected to an inert gas supply source (not illustrated). This inert gas injection valve 46 and the inert gas supply source allow inert gas to be introduced into the main heating chamber 41 in the range of $10^{-5}$ to 10000 Pa. The inert gas may be, for example, Ar, He, or $N_2$.

The inert gas injection valve 46 is a dopant gas supply means that can supply a dopant gas into the main container 30. That is, by selecting a dopant gas (for example, $N_2$) as the inert gas, the doping concentration in the growth layer can be adjusted.

The preheating chamber 42 is connected to the main heating chamber 41, and is configured to allow the refractory material container 50 to be moved by the moving means 43. The preheating chamber 42 of the present embodiment is configured to be heated by the residual heat of the heaters 44 of the main heating chamber 41. For example, when the main heating chamber 41 is heated to 2000° C., the preheating chamber 42 is heated to about 1000° C., which allows the degassing treatment of the object to be treated (for example, the SiC substrate 10, the main container 30, or the refractory material container 50).

The moving means 43 is configured to place the refractory material container 50 and move it between the main heating chamber 41 and the preheating chamber 42. The transfer between the main heating chamber 41 and the preheating chamber 42 by the moving means 43 can be completed in as little as one minute, so that temperature rise and fall at from 1 to 1000° C./min can be achieved.

This ability to rapidly raise and lower the temperature makes it possible to observe the surface topography without low-temperature growth history during temperature rise and fall, which has been difficult with known apparatus.

In FIG. 10, the preheating chamber 42 is placed below the main heating chamber 41, but it may be placed in any other direction.

The moving means 43 according to the present embodiment is a moving table on which the refractory material container 50 is to be placed. A small amount of heat is released from the contact area between the moving table and the refractory material container 50. This forms a temperature gradient in the refractory material container 50 (and in the main container 30).

In the heating furnace 40 of the present embodiment, since the bottom of the refractory material container 50 is in contact with the moving table, a temperature gradient is provided so that the temperature decreases from the upper container 51 to the lower container 52 of the refractory material container 50. This temperature gradient is preferably formed along the front and back direction of the SiC substrate 10.

The temperature gradient may be formed by the configuration of the heaters 44 as described above. In addition, the heaters 44 may be configured to reverse the temperature gradient.

(Refractory Material Container)

The heating furnace 40 is preferably capable of forming an atmosphere containing Si elements and heating the main container 30 in this atmosphere. The atmosphere containing Si elements in the heating furnace 40 according to the present embodiment is formed using the refractory material container 50 and the Si-vapor supply source 54.

Any method that enables the formation of an atmosphere containing Si elements around the main container 30 can naturally be used.

The refractory material container 50 includes a high-melting point material. Examples thereof include C which is a general-purpose heat-resistant material, W, Re, Os, Ta, and Mo which are high-melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, and $TiB_2$ which are borides, and polycrystalline SiC.

This refractory material container 50, like the main container 30, is a fitting container including the upper container 51 and the lower container 52 that can be fitted to each other, and is configured to house the main container 30. A minute gap 53 is formed at the fitting portion between the upper container 51 and the lower container 52, through which the inside of the refractory material container 50 can be evacuated (vacuated).

The refractory material container 50 preferably has a Si-vapor supply source 55 that can supply vapor pressure of a gas phase species containing Si elements in the refractory material container 50. The Si-vapor supply source 55 should be configured to generate Si-vapor in the refractory material container 50 during heating, and examples thereof include solid Si (Si pellets such as single crystal Si pieces and Si powder) and Si compounds.

This SiC substrate producing apparatus according to the present embodiment uses TaC as the material of the refractory material container 50 and tantalum silicide as the Si-vapor supply source 55. That is, as illustrated in FIGS. 5, 7, and 9, a tantalum silicide layer is formed inside the refractory material container 50, and the container is configured so that Si-vapor is supplied from the tantalum silicide layer into the container during heating, thereby forming a Si-vapor pressure environment.

Other configurations may be used as long as the vapor pressure of a gas phase species containing Si elements is formed in the refractory material container 50 during heating.

<<SiC Semiconductor Device and Method for Producing SiC Semiconductor Device>>

The following is an example of producing a pin diode from the SiC substrate 10 according to the present embodiment. For example, an n-channel pin diode is produced using the SiC substrate 10 of n type according to the present embodiment. At this time, the base substrate 11 functions as a cathode region, the dislocation conversion layer 12 functions as a buffer layer, and the epitaxial growth layer 13 functions as a true semiconductor layer (i-layer).

First, a p+ type anode region is formed by implanting p type impurities such as aluminum (Al) into the surface layer on the main surface side of the epitaxial growth layer 13 using the ion implantation method.

Next, an anode electrode is formed on the top surface of the anode region by depositing nickel (Ni) or the like and heat-treating it, and a cathode electrode is formed on the top surface of the cathode region. Thus, an n-channel pin diode can be produced.

Here, the method for producing a SiC semiconductor device has been described using the n-channel pin diode as an example, but the SiC substrate of the present invention is also applicable to, for example, bipolar elements, insulated gate bipolar transistor (IGBT) elements, and parasitic diodes having a metal oxide semiconductor (MOS) structure.

In the embodiment, the dislocation conversion layer 12 of the n+ type layer and the epitaxial growth layer 13 of the n type layer are stacked on the main surface of the n+ type SiC substrate 10. However, the configuration may be that the dislocation conversion layer 12 of the p+ type layer and the epitaxial growth layer 13 of the p type layer are stacked on the main surface of the p+ type SiC substrate.

EXAMPLES

Hereinafter, the present invention will be described more specifically with reference to Examples 1, 2, and 3, and Comparative Examples 1, 2, and 3.

Example 1

The SiC substrate 10 after removal of the subsurface damaged layer 111 was housed in the main container 30 and the refractory material container 50 (see FIG. 11) and heat-treated under the following heat treatment conditions. In Example 1, the main container 30 is made of polycrystalline SiC, so that the main container 30 itself functions as the SiC material body 20 (Si element supply source and C element supply source).

[SiC Substrate 10]

Polymorphism: 4H—SiC

Substrate size: horizontal width 10 mm×vertical width 10 mm×thickness 0.45 mm

Off-direction and off-angle: 4° off in <11-20> direction

Growth surface: (0001) plane

Presence or absence of subsurface damaged layer 111: absent

Presence or absence of MSB: absent

Step 14 height: 1.0 nm

Terrace width W1: 14 nm

The presence or absence and depth of the subsurface damaged layer 111 were confirmed by the SEM-EBSD method. The presence or absence and the depth of the subsurface damaged layer 111 can also be confirmed by TEM, μXRD, or Raman spectroscopy.

The presence or absence of MSB was confirmed by AFM and the method of evaluating SEM image contrast described in JP 2015-179082 A.

The height of the steps 14 was measured by AFM.

As the value of terrace width W (including the terrace width W1 and the terrace width W2), a line perpendicular to the steps 14 in the SEM image taken was drawn and the number of the steps 14 existing on this line was counted, thereby adopting the average value of the terrace width (terrace width W=line length/number of steps on the line).

[Main Container 30 (SiC Material Body 20)]

Material: polycrystalline SiC

Container size: diameter 60 mm×height 4 mm

Distance between SiC substrate 10 and top surface of main container 30: 2 mm Atomic number ratio Si/C in the container: 1 or less Dopant: N Doping concentration: from $5 \times 10^{17}$ cm$^{-3}$ to $5 \times 10^{18}$ cm$^{-3}$

[Refractory Material Container 50]

Material: TaC

Container size: 160 mm (diameter)×60 mm (height)

Si-vapor supply source 54 (Si compound): TaSi$_2$

[Heat Treatment Conditions]

The SiC substrate 10 placed under the aforementioned conditions was heat-treated under the following conditions.

Heating temperature: 1800° C.

Heating time: 8 min

Growth amount: 0.5 μm

Temperature gradient: 1° C./mm

By heating under the aforementioned heat treatment conditions, the dislocation conversion layer 12 was grown on the SiC substrate 10 (crystal growth step S2). In Example 1, the dislocation conversion layer 12 was grown by 0.5 but it can be grown by 1 μm or more by increasing the heating time.

Figure 12:
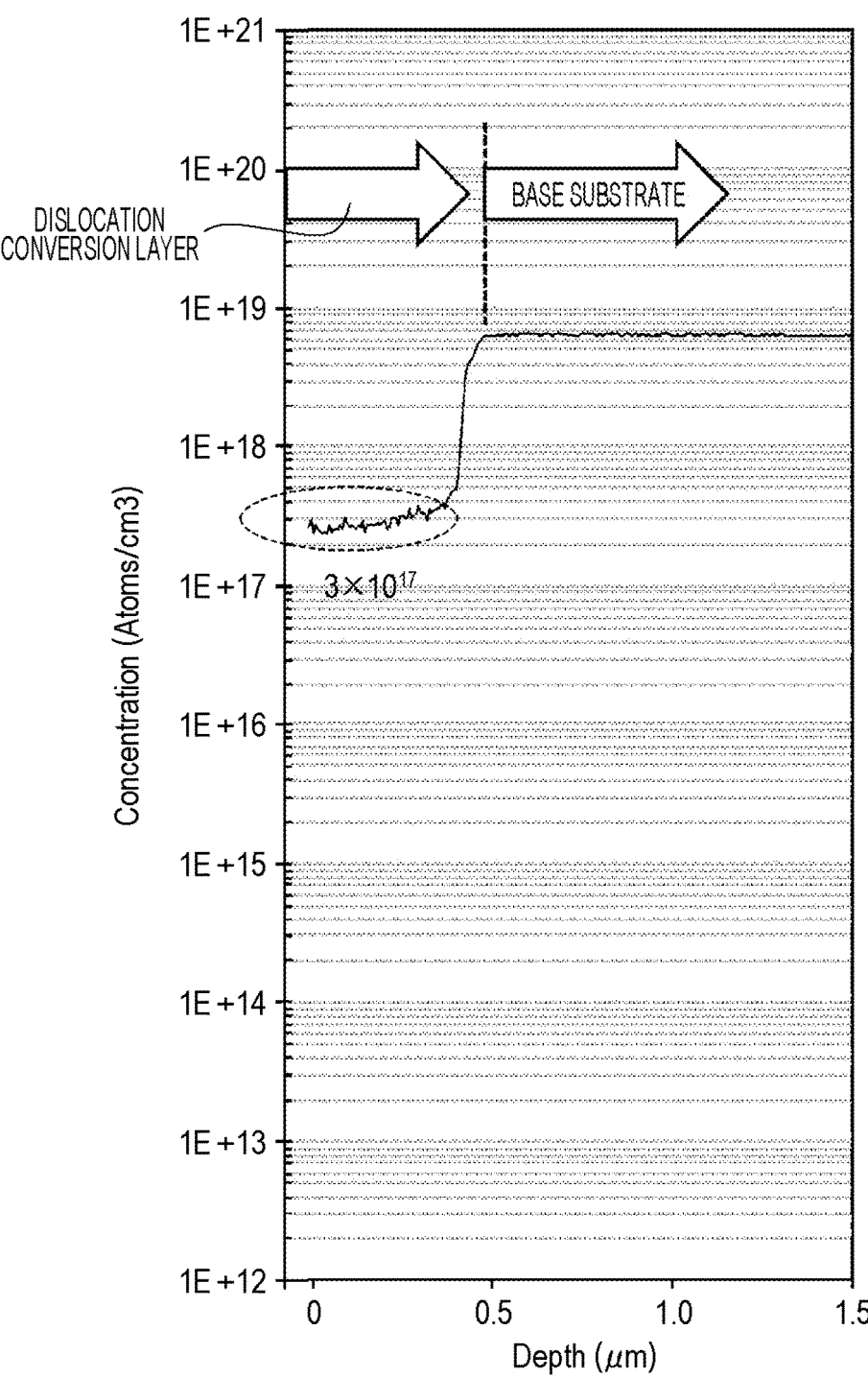
FIG. 12 illustrates the result of SIMS analysis of the SiC substrate according to Example 1.

FIG. 12 illustrates the result of SIMS analysis of the SiC substrate of Example 1. As illustrated in FIG. 12, the doping concentration of the dislocation conversion layer 12 of Example 1 was $3 \times 10^{17}$ cm$^{-3}$, and the doping concentration of the base substrate 11 was $6 \times 10^{18}$ cm$^{-3}$.

The dislocation conversion layer 12 grown in the crystal growth step S2 in Example 1 is as follows.

[Dislocation Conversion Layer 12]

Dopant: N

Doping concentration: $3 \times 10^{17}$ cm$^{-3}$

Presence or absence of MSB: present

Step 14 height: >1.0 nm

Step edge shape: Zigzag shape

Terrace width W2: 55 nm

BPD to TED conversion rate: 100%

Figure 13:
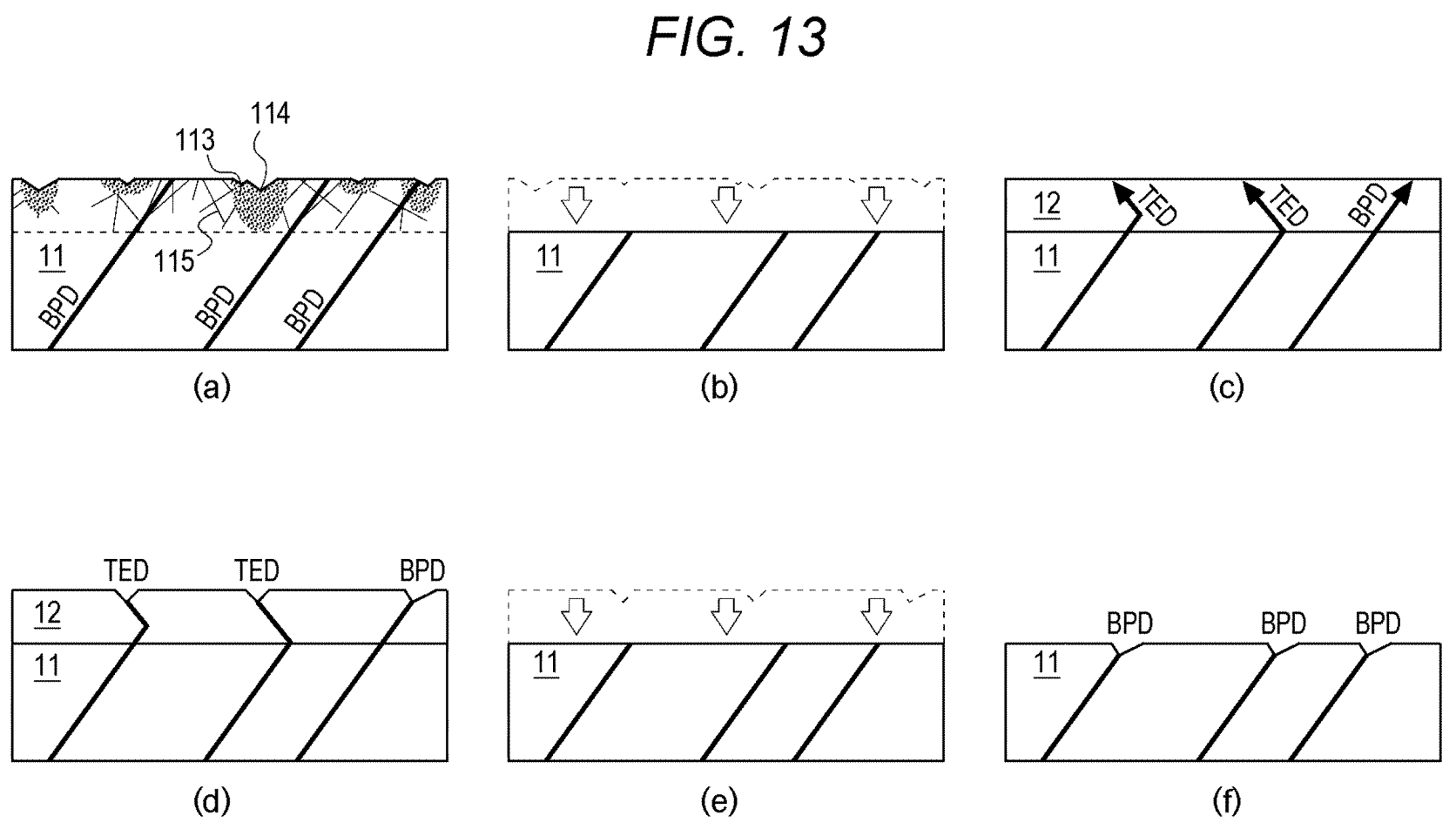

FIG. 13 illustrates the method for determining the conversion rate from BPDs to other defects and dislocations (for example, TED) during the crystal growth step S2.

FIG. 13(*a*) illustrates the base substrate 11 having the subsurface damaged layer 111. At this stage, the BPDs are present from the bulk layer 112 to the subsurface damaged layer 111.

FIG. 13(*b*) illustrates the base substrate 11 after the removal of the subsurface damaged layer 111 by the subsurface damaged layer removal step S1. At this stage, BPDs exist in the base substrate 11 (bulk layer 112).

FIG. 13(*c*) illustrates the SiC substrate 10 on which dislocation conversion layer 12 was grown by the crystal growth step S2. In this step, the BPDs present in the bulk layer 112 are converted to TEDs with a certain probability.

Here, TEDs and BPDs are mixed on the surface of the dislocation conversion layer 12, unless the BPDs are 100% converted.

FIG. 13(*d*) illustrates the confirmation of defects in the dislocation conversion layer 12 using the KOH dissolution etching method on the SiC substrate 10 after the crystal growth step S2. In the KOH dissolution etching method, the SiC substrate is immersed in dissolved salt (for example, KOH) heated to about 500° C., etch pits are formed in the dislocation or defect area, and the type of dislocation is determined by the size and shape of the etch pits. By this method, the number of BPDs propagated in the dislocation conversion layer 12 after the crystal growth step S2 is obtained.

FIG. 13(*e*) illustrates the removal of the dislocation conversion layer 12 after the KOH dissolution etching method. In this method, after planarization by mechanical polishing or CMP to the etch pit depth, the dislocation conversion layer 12 is removed by the SiVE method or the like to reveal the base substrate 11 (bulk layer 112).

FIG. 13(*f*) illustrates the confirmation of defects in the base substrate 11 using the KOH dissolution etching method on the base substrate 11 after removal of the dislocation conversion layer 12. By this method, the number of BPDs present in the base substrate 11 immediately below the dislocation conversion layer 12 is obtained.

By comparing the number of BPDs propagated in the dislocation conversion layer 12 in FIG. 13(*d*) with the number of BPDs present on the surface of the base substrate 11 in FIG. 13(*f*), according to the sequence illustrated in FIG. 13, the BPD to TED conversion rate, which is the conversion of BPDs to other defects and dislocations during the crystal growth step S2, can be obtained.

According to Example 1, by growing the dislocation conversion layer 12 in a SiC—C equilibrium vapor pressure environment on a surface having no MSBs, a SiC substrate with the dislocation conversion layer 12 having a doping concentration of $1 \times 10^{17}$ cm$^{-3}$ or more and a high BPD to TED conversion rate can be produced.

In Example 1, the dislocation conversion layer 12 having a doping concentration of $1 \times 10^{17}$ cm$^{-3}$ or more was formed using the SiC material body 20 having a doping concentration of $5 \times 10^{17}$ cm$^{-3}$ to $5 \times 10^{18}$ cm$^{-3}$, and this doping concentration can be increased by introducing a dopant gas.

Examples 2 and 3

Next, the heat treatment conditions that improve the BPD to TED conversion rate will be explained in detail with reference to Example 2, Example 3, Comparative Example 1, Comparative Example 2, and Comparative Example 3.

The SiC semiconductor substrates of Example 2, Example 3, Comparative Example 1, Comparative Example 2, and Comparative Example 3 were produced under the conditions in Table 1. The depth of the subsurface damaged layer 111 of the SiC substrate 10 used in these examples and comparative examples was confirmed to be about 5 μm by SEM-EBSD. The size of the refractory material container 50 used is 160 mm in diameter×60 mm in height, and the size of the main container 30 is 60 mm in diameter×4 mm in height.

TABLE 1

| | | Example 2 | Example 3 | Comparative Example 1 | Comparative Example 2 | Comparative Example 3 |
|---|---|---|---|---|---|---|
| SiC substrate 10 before subsurface damaged layer removal step S1 | Polytype | 4H—SiC | 4H—SiC | 4H—SiC | 4H—SiC | 4H—SiC |
| | Off-angle (off-direction) | 4° off in <11-20> direction | 4° off in <11-20> direction | 4° off in <11-20> direction | 4° off in <11-20> direction | 4° off in <11-20> direction |
| | Substrate size [mm] | 10 × 5 | 10 × 5 | 10 × 5 | 10 × 5 | 10 × 5 |
| | Presence or absence of MSB | Absent | Absent | Absent | Absent | Absent |
| | Surface finish | CMP | CMP | CMP | CMP | CMP |
| | Step 14 height [nm] | 0.25 to 1 | 0.25 to 1 | 0.25 to 1 | 0.25 to 1 | 0.25 to 1 |
| | Terrace 15 width [nm] | 7 | 7 | 7 | 7 | 7 |
| | Presence or absence of subsurface damaged layer 111 | Present | Present | Present | Present | Present |
| SiVE conditions (Subsurface damaged layer removal step S1) | Heating temperature [° C.] | 1800 | 1800 | — | 1945 | 1800 |
| | Etching time [min] | 60 | 600 | — | 15 | 30 |
| | Etching amount [μm] | 20 | 8 | — | 10 | 10 |
| | Tantalum silicide layer | TasSi$_3$ | TasSi$_3$ | — | TasSi$_2$ | TasSi$_3$ |
| | Ar gas [Pa] | — | 10000 | — | — | — |
| SiC substrate 10 before crystal growth step S2 | Presence or absence of subsurface damaged layer 111 | Absent | Absent | Present | Absent | Absent |
| | Presence or absence of MSB | Absent | Present | Absent | Present | Absent |
| | Step 14 height [nm] | 1.0 | >1.0 | 0.25 to 1 | >1.0 | 1.0 |
| | Terrace with W1 [nm] | 14 | 26 | 7 | 50 | 14 |
| Sublimation conditions (Crystal growth step S2) | Growth temperature [° C.] | 1800 | 1800 | 1800 | 1800 | 1800 |
| | Growth time [min] | 360 | 360 | 360 | 360 | 360 |
| | Growth amount [μm] | 10 | 10 | 10 | 10 | 10 |
| | Si substrate amount [g] | None | None | None | None | 0.45 |
| | Atomic number ratio Si/C in container | 1 or less | 1 or less | 1 or less | 1 or less | More than 1 |
| | Growth environment | SiC—C equilibrium vapor pressure environment | SiC—C equilibrium vapor pressure environment | SiC—C equilibrium vapor pressure environment | SiC—C equilibrium vapor pressure environment | SiC—Si equilibrium vapor pressure environment |
| | Conditions | MSB formed | MSB formed | MSB formed | MSB formed | MSB decomposed |
| SiC substrate 10 after crystal growth step S2 | Presence or absence of MSB | Present | Present | Present | Present | Absent |
| | Step 14 height [nm] | >1.0 | >1.0 | >1.0 | >1.0 | 1.0 |
| | Step edge shape | Zigzag | Zigzag | Zigzag | Zigzag | Straight |
| | Terrance width W2 [nm] | 55 | 40 | 45 | 48 | 14 |
| Number of BPD | Number of BPD on dislocation conversion layer 12 | 0 | 2 | 12 | 2 | 15 |
| | Number of BPD on base substrate 11 | 1200 | 669 | 276 | 62 | 222 |
| Terrace width increase/decrease ratio [%] | | 292.86 | 53.85 | 542.85 | −4.00 | 0.00 |
| BPD to TED conversion rate | | 100.00 | 99.70 | 95.65 | 96.77 | 93.24 |

In Example 2, the subsurface damaged layer 111 was removed using the Si-vapor pressure etching method under the conditions that form no MSBs (subsurface damaged layer removal step S1), and then grown in a SiC—C equilibrium vapor pressure environment using sublimation (crystal growth step S2). As a result, the BPD to TED conversion rate of the dislocation conversion layer 12 was 100%. At this time, the terrace width W1 before the crystal growth step S2 was 14 nm, and the terrace width W2 after the crystal growth step S2 was 55 nm (terrace width increase/decrease ratio=292.86%).

In Example 3, the subsurface damaged layer 111 was removed using the Si-vapor pressure etching method under the conditions that form MSBs (subsurface damaged layer removal step S1), and crystals were grown under the same conditions as in Example 2 (SiC—C equilibrium vapor pressure environment) (crystal growth step S2). As a result, the BPD to TED conversion rate of the dislocation conversion layer 12 was 99.7%. At this time, the terrace width W1 before the crystal growth step S2 was 26 nm, and the terrace width W2 after the crystal growth step S2 was 40 nm (terrace width increase/decrease ratio=53.85%).

The results indicate that when MSBs are formed on the surface of SiC substrate 10 before the growth of the dislocation conversion layer 12, the BPD to TED conversion rate is lower than that of Example 2.

In Comparative Example 1, crystals were grown under the same conditions (SiC—C equilibrium vapor pressure environment) as in Examples 2 and 3 (crystal growth step S2) without the subsurface damaged layer removal step S1 of removing the subsurface damaged layer 111. As a result, the BPD to TED conversion rate of the dislocation conversion layer 12 was 95.65%. At this time, the terrace width W1 before the crystal growth step S2 was 7 nm, and the terrace width W2 after the crystal growth step S2 was 45 nm (terrace width increase/decrease ratio=542.86%).

The results indicate that when the subsurface damaged layer 111 remains on the SiC substrate 10 before the growth of the dislocation conversion layer 12, the BPD to TED conversion rate is lower than that of Examples 2 and 3.

In Comparative Example 2, the subsurface damaged layer 111 was removed under conditions that form MSBs (sub-surface damaged layer removal step S1), and crystals were grown under the same conditions as in Examples 2 and 3 (SiC—C equilibrium vapor pressure environment) (crystal growth step S2). As a result, the BPD to TED conversion rate of the dislocation conversion layer 12 was 96.77%. At this time, the terrace width W1 before the crystal growth step S2 was 50 nm, and the terrace width W2 after the crystal growth step S2 was 48 nm (terrace width increase/decrease ratio=−4.00%).

The results indicate that when the SiC substrate is grown under the condition that the terrace width of the SiC sub-strate decreases in the crystal growth step S2, the BPD to TED conversion rate is lower than that of Examples 2 and 3.

In the subsurface damaged layer removal step S1 of Example 3, MSBs are formed by introducing Ar gas at 10000 Pa, whereas in the subsurface damaged layer removal step S1 of Comparative Example 2, MSBs are formed by adopting $TaSi_2$ as the tantalum silicide layer.

In Comparative Example 3, the subsurface damaged layer 111 was removed under the conditions that form no MSBs as in Example 2 (subsurface damaged layer removal step S1), and then crystals were grown in a SiC—Si equilibrium vapor pressure environment using sublimation (crystal growth step S2). This SiC—Si equilibrium vapor pressure environment is formed by placing a Si substrate in the main container 30. As a result, the BPD to TED conversion rate of the dislocation conversion layer 12 was 93.24%.

The results indicate that when crystals were grown in a SiC—Si equilibrium vapor pressure environment, the BPD to TED conversion rate was lower than that of Example 2.

Figure 14:
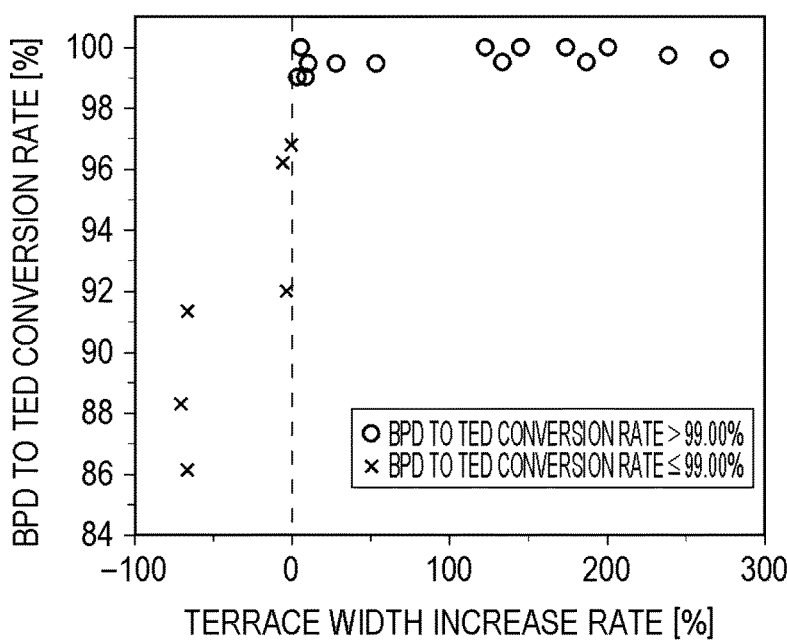
FIG. 14 is a graph showing the relationship between the BPD to TED conversion rate and the terrace width increase rate.

The inventors also studied and experimented intensively to see if there was any law to the BPD to TED conversion rate, and, As illustrated in FIG. 14, found that the BPD to TED conversion rate is strongly related to the rate of increase or decrease of the terrace width W before and after epitaxial growth (terrace width increase rate).

FIG. 14 is a graph plotting the terrace width increase rate ((terrace width before growth W2−terrace width after growth W1)/terrace width after growth W1) on the horizontal axis and the BPD to TED conversion rate on the vertical axis. The plots illustrated in FIG. 14 are the results of several experiments in which crystals were grown 3 μm on several SiC substrates 10 with different terrace widths W1, where the subsurface damaged layer 111 was removed, at growth temperatures of either 1700° C., 1800° C., or 1900° C., and under a SiC—Si equilibrium vapor pressure environment or a SiC—C equilibrium vapor pressure environment.

According to the results, when the terrace width increase rate was more than 0, i.e., when the crystal was grown under the condition that the terrace width W was increased during crystal growth on the SiC substrate 10 having the subsurface damaged layer 111 removed, the BPD to TED conversion rate was 99.00% or more.

In other words, since the method for producing a SiC substrate according to the present invention includes the subsurface damaged layer removal step S1 of removing the subsurface damaged layer 111 from the SiC substrate 10 and the crystal growth step S2 of growing crystals under conditions that increase the terrace width W of the SiC substrate 10, it can improve the BPD to TED conversion rate in the dislocation conversion layer 12.

In addition, in the method for producing a SiC substrate according to the present invention, the crystal growth step S2 includes growing the dislocation conversion layer 12 on the SiC substrate 10 having no MSBs, whereby the BPD to TED conversion rate in the dislocation conversion layer 12 can be made to be substantially 100%.

[Thermodynamic Calculation]

Figure 15:
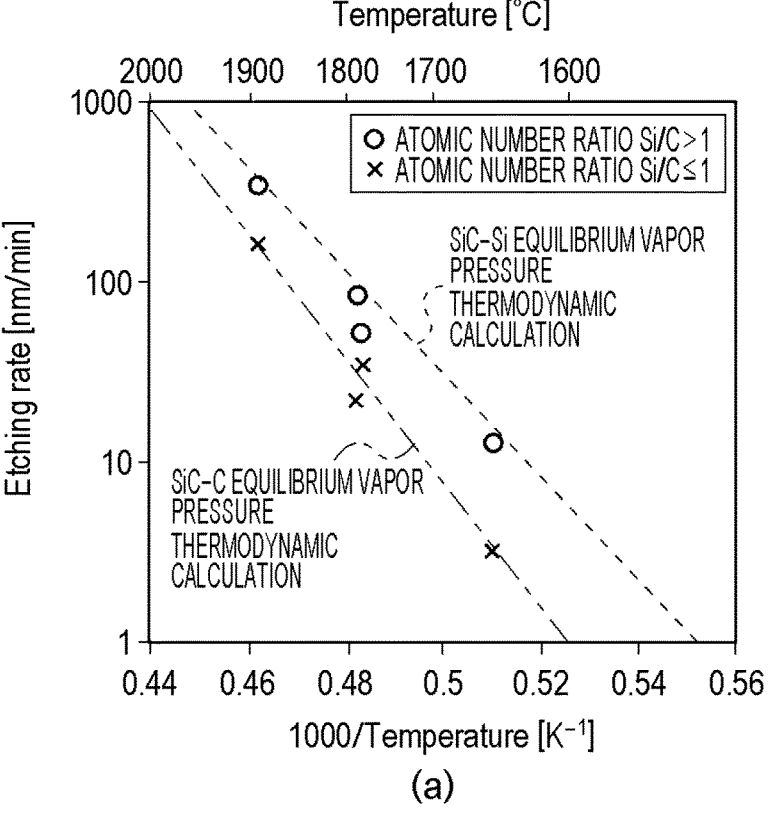
FIG. 15 is an Arrhenius plot during etching and crystal growth.
Figure 15:
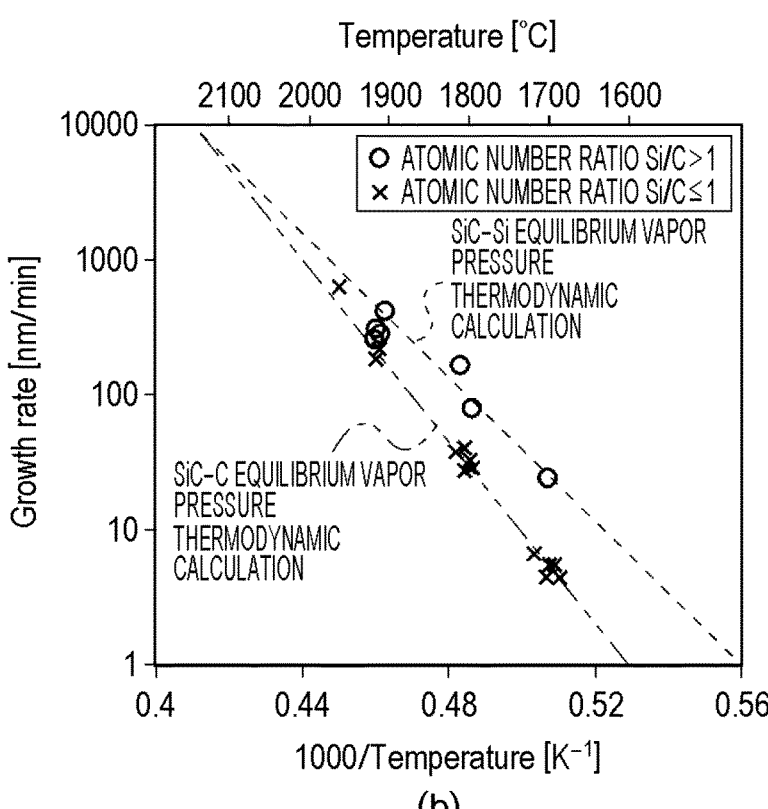

FIG. 15 (a) is a graph of the relationship between the heating temperature and the etching rate in the etching step of the present invention. The horizontal axis of this graph is the reciprocal of the temperature, and the vertical axis of this graph is the etching rate in logarithm.

FIG. 15(b) is a graph of the relationship between the heating temperature and the growth rate in the crystal growth step of the present invention. The horizontal axis of this graph is the reciprocal of the temperature, and the vertical axis of this graph is the logarithm of the growth rate.

In the graph in FIG. 15, the results of heat treatment of SiC substrate 10 by placing it in a space (in the main container 30) having an atomic number ratio Si/C of more than 1 are marked with ○. In addition, the results of heat treatment of the SiC substrate 10 by placing it in a space (in the main container 30) having an atomic number ratio Si/C of 1 or less are marked with x.

All the points on the surface of the SiC substrate 10 marked with ○ had no MSBs, and the height of the steps 14 was the height of one unit cell. On the other hand, all the points on the surface of the SiC substrate 10 marked with x had MSBs.

In the graphs of FIG. 15, the results of thermodynamic calculations in a SiC—Si equilibrium vapor pressure environment are depicted as dashed lines (Arrhenius plots), and the results of thermodynamic calculations in the SiC—C equilibrium vapor pressure environment are depicted as double-dotted lines (Arrhenius plots).

Hereinafter, the thermodynamic calculation of the etching step and the thermodynamic calculation of the crystal growth step will be described in detail separately.

(Thermodynamic Calculation of Etching Step)

In the thermodynamic calculation of the etching step, the amount of vapor (a gas phase species containing Si elements and the gas phase species containing C element) generated from the SiC substrate 10 when the main container 30 is heated can be converted to the etching amount. In this case, the etching rate of the SiC substrate 10 is obtained by the following equation 1:

$$\text{Etching rate}\,(m/s) \propto \sum_{i=SiC,Si_2C,SiC_2} \frac{P_i}{\sqrt{2\pi m_i kT}} \qquad \text{[Equation 1]}$$

where T is the temperature of the SiC substrate 10, $m_i$ is the mass of one molecule of the gas phase species ($Si_xC_y$), and k is the Boltzmann constant;

$P_i$ is the sum of the vapor pressures generated in the main container 30 during heating of the SiC substrate 10. The gas phase species of $P_i$ may be, for example, SiC, $Si_2C$, and $SiC_2$.

The dashed line in FIG. 15(*a*) is the result of thermodynamic calculations for etching of single crystal SiC in the environment of vapor pressure when SiC (solid) and Si (liquid phase) are in phase equilibrium through a vapor phase. Specifically, thermodynamic calculations were performed using the equation 1 under the following conditions (i) to (iv): (i) the environment is a SiC—Si equilibrium vapor pressure environment having a constant volume; (ii) the etching driving force is the temperature gradient in the main container 30; (iii) the source material gases are SiC, $Si_2C$, and $SiC_2$; and (iv) the desorption coefficient at which the source materials sublimate from the steps 14 is 0.001.

The double-dotted line in FIG. 15(*a*) is the result of thermodynamic calculations for etching of single crystal SiC in the environment of vapor pressure when SiC (solid phase) and C (solid phase) are in phase equilibrium through a vapor phase. Specifically, thermodynamic calculations were performed using the equation 1 under the following conditions (i) to (iv): (i) the environment is a SiC—C equilibrium vapor pressure environment having a constant volume; (ii) the etching driving force is the temperature gradient in the main container 30; (iii) the source material gases are SiC, $Si_2C$, and $SiC_2$; and (iv) the desorption coefficient at which the source materials sublimate from the steps 14 is 0.001.

The data for each chemical species used in the thermodynamic calculations were used from JANAF thermochemical tables.

According to the graphs in FIG. 15(*a*), the results of etching of the SiC substrate 10 by placing it in a space (in the main container 30) having an atomic number ratio Si/C of more than 1 (marked with ○) indicates a trend that is consistent with the results of thermodynamic calculations of single crystal SiC etching in a SiC—Si equilibrium vapor pressure environment.

In addition, the results of etching of the SiC substrate 10 by placing it in a space (in the main container 30) having an atomic number ratio Si/C of 1 or less (marked with x) indicate a trend that is consistent with the results of thermodynamic calculations of single crystal SiC etching in the SiC—C equilibrium vapor pressure environment.

At the points marked with ○, where etching was performed in a SiC—Si equilibrium vapor pressure environment, the formation of MSBs was decomposed and suppressed, and the steps 14 having a height of 1 nm (one unit cell) were aligned on the surface of the SiC substrate 10.

On the other hand, the points marked with x that had been etched in the SiC—C equilibrium vapor pressure environment had MSBs.

(Thermodynamic Calculation of Crystal Growth Step)

Next, in the thermodynamic calculation of the crystal growth step, the partial pressure difference between the SiC material and the vapor generated from the SiC substrate when heated in the main container 30 can be converted into the growth amount. The growth driving force may be chemical potential difference or temperature gradient. The chemical potential difference may be the partial pressure difference of the gas phase species generated at the surface of the polycrystalline SiC (SiC material body 20) and the single crystal SiC (the SiC substrate 10). In this case, the growth rate of SiC is obtained by the following equation 2:

$$\text{Growth rate}\,(m/s) \propto \sum_{i=SiC,Si_2C,SiC_2} \frac{(P_{material\,i} - P_{substrate\,i})}{\sqrt{2\pi m_i kT}} \qquad \text{[Equation 2]}$$

where T is the temperature of the SiC material side, $m_i$ is the mass of one molecule of the gas phase species ($Si_xC_y$), and k is the Boltzmann constant;

The $P_{material\,i} - P_{substrate\,i}$ is the growth amount where the source material gas becomes supersaturated and precipitated as SiC, and the source material gas may be SiC, $Si_2C$, or $SiC_2$.

Therefore, the dashed line in FIG. 15(*b*) is the result of thermodynamic calculation when single crystal SiC is grown from polycrystalline SiC in the vapor pressure environment when SiC (solid) and Si (liquid phase) are in phase equilibrium through a vapor phase.

Specifically, thermodynamic calculations were performed using the equation 2 under the following conditions (i) to (iv): (i) the environment is a SiC—Si equilibrium vapor pressure environment having a constant volume; (ii) the growth driving force is the temperature gradient in the main container 30 and the vapor pressure difference (chemical potential difference) between polycrystalline SiC and single crystal SiC; (iii) the source material gases are SiC, $Si_2C$, and $SiC_2$; and (iv) the adsorption coefficient of the source material on the steps of the SiC substrate 10 is 0.001.

The double-dotted line in FIG. 15(*b*) is the result of thermodynamic calculation when single crystal SiC is grown from polycrystalline SiC in the vapor pressure environment when SiC (solid phase) and C (solid phase) are in phase equilibrium through a vapor phase.

Specifically, thermodynamic calculations were performed using the equation 2 under the following conditions (i) to (iv): (i) the environment is a SiC—C equilibrium vapor pressure environment having a constant volume; (ii) the growth driving force is the temperature gradient in the main container 30 and the vapor pressure difference (chemical potential difference) between polycrystalline SiC and single crystal SiC; (iii) the source material gases are SiC, $Si_2C$, and $SiC_2$; and (iv) the adsorption coefficient of the source material on the steps of the SiC substrate 10 is 0.001.

The data for each chemical species used in the thermodynamic calculations were used from JANAF thermochemical tables.

According to the graphs in FIG. 15(*b*), the results of growing the growth layer on the SiC substrate 10 by placing it in a space (in the main container 30) having an atomic number ratio Si/C of more than 1 (marked with ○) indicates a trend that is consistent with the results of thermodynamic calculations of SiC growth in a SiC—Si equilibrium vapor pressure environment.

In addition, the results of growing the growth layer on the SiC substrate 10 by placing it in a space (in the main container 30) having an atomic number ratio Si/C of 1 or less (marked with x) indicate a trend that is consistent with the results of thermodynamic calculations of SiC growth in the SiC—C equilibrium vapor pressure environment.

Figure 16:
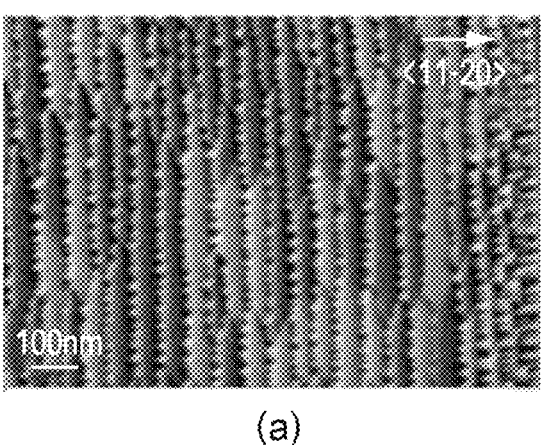
FIG. 16 depicts SEM images of the SiC substrate surface after etching and crystal growth.
Figure 16:
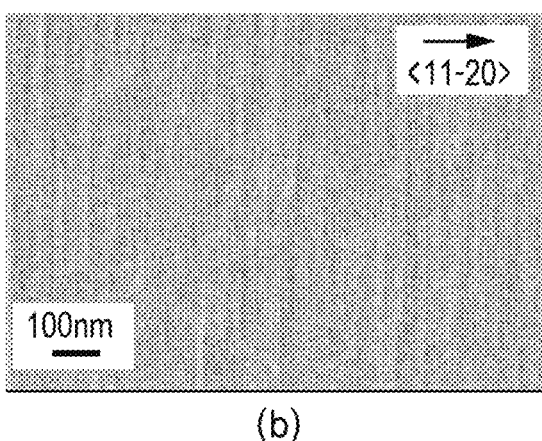

FIG. 16(a) is an SEM image of the 4H—SiC (0001) plane side, which was grown at 1800° C. with the atomic number ratio Si/C 1 or less in the main container 30. That is, this is an example of the X-marked point in FIG. 15(b), and is an example of the surface of the SiC substrate 10 grown in the SiC—C equilibrium vapor pressure environment. The surface profile obtained under these conditions has a step-terrace structure having, for example, a terrace width W of 40 to 200 nm and a step 14 height of 3 to 14 nm, indicates that MSBs having a zigzag shape at the step edges had been formed.

FIG. 16(b) is an SEM image of the 4H—SiC (0001) plane side, which was grown at 1800° C. having an atomic number ratio Si/C of more than 1 in the main container 30. That is, this is an example of the ○-marked point in FIG. 15(b), and is an example of the surface grown in a SiC—Si equilibrium vapor pressure environment. The surface profile obtained under these conditions had a step-terrace structure having a terrace width of 14 nm and a step height of 1.0 nm (full unit cell), indicating that no MSBs were formed.

The step height and terrace width can be confirmed by AFM or the method of evaluating SEM image contrast described in JP 2015-179082 A.

REFERENCE SIGNS LIST

10 SiC substrate
11 Base substrate
111 Subsurface damaged layer
112 Bulk layer
113 Strain
114 Scratch
115 Latent scratches
12 Dislocation conversion layer
13 Epitaxial growth layer
14 Step
15 Terrace
20 SiC material body
30 Main container
31 Upper container
32 Lower container
33 Gap
34 Substrate holder
35 Si-vapor supply source
40 Heating furnace
41 Main heating chamber
42 Preheating chamber
43 Moving means
44 Heater
45 Vacuum formation valve
46 Inert gas injection valve
47 Vacuum gauge
50 Refractory material container
51 Upper container
52 Lower container
53 Gap
54 Si-vapor supply source
X Etching space
Y Crystal growth space S1 Subsurface damaged layer removal step
S2 Crystal growth step
S3 Epitaxial growth step
S4 Bunching decomposition step

The invention claimed is:

1. A SiC substrate comprising a base substrate and a dislocation conversion layer having a doping concentration of $1\times10^{15}$ cm$^{-3}$ or more,
  wherein the dislocation conversion layer is a single layer formed directly above the base substrate and has a conversion rate from the basal plane dislocation to the threading edge dislocation of more than 95%, and
  wherein, in the base substrate, a subsurface damaged layer is removed and a macro-step bunching is decomposed such that the base substrate has a main surface having steps of one unit cell height.

2. The SiC substrate according to claim 1, comprising a dislocation conversion layer having a doping concentration of $1\times10^{17}$ cm$^{-3}$ or more.

3. The SiC substrate according to claim 1, wherein the dislocation conversion layer has a thickness of 1 μm or more.

4. The SiC substrate according to claim 1, wherein the dislocation conversion layer has a conversion rate from the basal plane dislocation to the threading edge dislocation of 100%.

5. The SiC substrate according to claim 1, further comprising an epitaxial growth layer formed directly above the dislocation conversion layer,
  wherein the doping concentration of the dislocation conversion layer is higher than the doping concentration of the epitaxial growth layer.

6. A SiC semiconductor device comprising a base substrate and a dislocation conversion layer having a doping concentration of $1\times10^{15}$ cm$^{-3}$ or more,
  wherein the dislocation conversion layer is a single layer formed directly above the base substrate and has a conversion rate from the basal plane dislocation to the threading edge dislocation of more than 95%, and
  wherein, in the base substrate, a subsurface damaged layer is removed and a macro-step bunching is decomposed such that the base substrate has a main surface having steps of one unit cell height.

7. The SiC semiconductor device according to claim 6, comprising a dislocation conversion layer having a doping concentration of $1\times10^{17}$ cm$^{-3}$ or more.

8. The SiC semiconductor device according to claim 6, wherein the dislocation conversion layer has a thickness of 1 μm or more.

9. The SiC semiconductor device according to claim 6, wherein the dislocation conversion layer has a conversion rate from the basal plane dislocation to the threading edge dislocation of 100%.

10. The SiC semiconductor device according to claim 6, further comprising an epitaxial growth layer formed directly above the dislocation conversion layer,
  wherein the doping concentration of the dislocation conversion layer is higher than the doping concentration of the epitaxial growth layer.

* * * * *